(12) United States Patent
Yoshida et al.

(10) Patent No.: US 8,829,121 B2
(45) Date of Patent: Sep. 9, 2014

(54) PIEZOELECTRIC POLYMER MATERIAL AND METHOD FOR PRODUCING SAME

(75) Inventors: Mitsunobu Yoshida, Ichihara (JP); Shunsuke Fujii, Ichihara (JP); Hitoshi Onishi, Chiba (JP); Yoshiro Tajitsu, Suita (JP); Taizo Nishimoto, Chiba (JP); Kazuhiro Tanimoto, Chiba (JP); Kenichi Goto, Chiba (JP)

(73) Assignees: Mitsui Chemicals, Inc., Minato-ku, Tokyo (JP); A School Corporation Kansai University, Suita-shi, Osaka (JP)

( * ) Notice: Subject to any disclaimer, the term of this patent is extended or adjusted under 35 U.S.C. 154(b) by 244 days.

(21) Appl. No.: 13/369,486

(22) Filed: Feb. 9, 2012

(65) Prior Publication Data

US 2012/0132846 A1    May 31, 2012

Related U.S. Application Data

(63) Continuation-in-part of application No. PCT/JP2011/069061, filed on Aug. 24, 2011.

(30) Foreign Application Priority Data

| Aug. 25, 2010 | (JP) | 2010-188924 |
| Sep. 10, 2010 | (JP) | 2010-203671 |
| Apr. 18, 2011 | (JP) | 2011-092349 |

(51) Int. Cl.
| C08G 63/08 | (2006.01) |
| C08L 67/04 | (2006.01) |
| H01L 41/193 | (2006.01) |
| H01L 41/45 | (2013.01) |
| C08L 27/16 | (2006.01) |

(52) U.S. Cl.
CPC .............. *C08L 67/04* (2013.01); *C08L 27/16* (2013.01); *H01L 41/193* (2013.01); *H01L 41/45* (2013.01)
USPC ....... 525/450; 252/62.9 R; 264/479; 264/291; 525/410; 525/411; 525/415; 528/361; 528/502 B

(58) Field of Classification Search
CPC ........ C08G 63/02; C08G 63/06; C08G 63/08; C08J 5/18; C08J 2367/04; B29D 7/01; H01L 41/0478; H01L 41/18; H01L 41/22; H01L 41/33; H01L 41/35
USPC ..................... 252/62.9, 62.9 R; 264/479, 291; 525/410, 411, 415, 450; 528/361, 528/502 B
See application file for complete search history.

(56) References Cited

U.S. PATENT DOCUMENTS

| 5,298,602 A | 3/1994 | Shikinami et al. |
| 2012/0025674 A1 * | 2/2012 | Yoshida et al. ............... 310/365 |

FOREIGN PATENT DOCUMENTS

| JP | 5-152638 A | 6/1993 | |
| JP | 6-142182 A | 5/1994 | |
| JP | 6-142184 A | 5/1994 | |
| JP | 7-207041 A | 8/1995 | |
| JP | 2005-213376 | * 8/2005 | ............. C08L 67/04 |
| JP | 2005-213376 A | 8/2005 | |

OTHER PUBLICATIONS

International Search Report (PCT/ISA/210) issued on Sep. 20, 2011, by Japanese Patent Office as the International Searching Authority for International Application No. PCT/JP2011/069061.
Written Opinion (PCT/ISA/237) issued on Sep. 20, 2011, by Japanese Patent Office as the International Searching Authority for International Application No. PCT/JP2011/069061.

* cited by examiner

*Primary Examiner* — Robert Jones, Jr.
(74) *Attorney, Agent, or Firm* — Buchanan, Ingersoll & Rooney PC

(57) ABSTRACT

The invention provides a piezoelectric polymer material comprising a helical chiral polymer having a weight average molecular weight of from 50,000 to 1,000,000 and optical activity, the piezoelectric polymer material having: crystallinity as obtained by a DSC method of from 20% to 80%; a transmission haze with respect to visible light of 50% or less; and a product of the crystallinity and a standardized molecular orientation MORc, which is measured with a microwave transmission-type molecular orientation meter at a reference thickness of 50 μm, of from 40 to 700.

20 Claims, 1 Drawing Sheet

PIEZOELECTRIC POLYMER MATERIAL AND METHOD FOR PRODUCING SAME

CROSS-REFERENCE TO RELATED APPLICATION

This application is a continuation-in-part of PCT international application No. PCT/JP2011/069061 filed Aug. 24, 2011, which claims priority under 35 USC 119 from Japanese Patent Application No. 2010-188924 filed Aug. 25, 2010, Japanese Patent Application No. 2010-203671 filed Sep. 10, 2010, and Japanese Patent Application No. 2011-092349 filed Apr. 18, 2011, the disclosures of which are incorporated by reference herein.

BACKGROUND OF THE INVENTION

1. Technical Field

The present invention relates to a piezoelectric polymer material and a method for producing the piezoelectric polymer material.

2. Related Art

As piezoelectric materials, conventionally, PZT ($PBZrO_3$—$PbTiO_3$-based solid solution), which is a ceramic material, has often been used. However, since PZT contains lead, piezoelectric polymer materials, which are more environmentally friendly and highly flexible, have been increasingly used.

The currently known piezoelectric polymer materials are generally classified into the following two types, i.e., poled polymers including nylon 11, polyvinyl fluoride, polyvinyl chloride, polyurea and the like, and ferroelectric polymers including polyvinylidene fluoride (β-type) (PVDF), vinylidene fluoride-trifluoroethylene copolymer (P (VDF-TrFE)) (75/25) and the like.

However, since piezoelectric polymer materials are inferior to PZT in terms of piezoelectricity, there is demand for improvement in piezoelectricity of piezoelectric polymer materials. Therefore, attempts have been made from various viewpoints in order to improve piezoelectricity of the piezoelectric polymer materials.

For example, PVDF and P(VDF-TrFE), which are ferroelectric polymers, exhibit excellent piezoelectricity among polymers and have a piezoelectric constant $d_{31}$ of 20 pC/N or more. In order to impart piezoelectricity to film materials formed from PVDF or P(VDF-TrFE), polymer chains are oriented in a stretching direction by performing stretching and opposite charges are applied to both sides of the film by corona discharge or the like, whereby an electric field is generated in a direction perpendicular to the film surface and permanent dipoles, containing fluorine in side chains of the polymer chains, are oriented in a direction parallel to the electric field direction.

However, there have been problems from practical viewpoints in that opposite charges, such as water and ions in air, easily attach to the polarized film surface in a direction of canceling the orientation and, as a result, orientation of the permanent dipoles that have been arranged by the poling treatment is loosened, thereby causing a significant decrease in piezoelectricity with time.

PVDF is a material that exhibits the highest piezoelectricity among the piezoelectric polymer materials. However, since it has a comparatively high dielectric constant, which is 13, among piezoelectric polymer materials, the value of a piezoelectric g constant (open circuit voltage per unit stress), which is a value obtained by dividing a piezoelectric d constant by the dielectric constant, is small. In addition, although PVDF exhibits a favorable conversion efficiency from electricity to sound, its conversion efficiency from sound to electricity is yet to be improved.

In recent years, polymers having optical activity, such as polypeptides and polylactic acids, have gathered attention in addition to the piezoelectric polymer materials as described above. Polylactic acid-based polymers are known to exhibit piezoelectricity by simply performing mechanical stretching.

Among polymers having optical activity, piezoelectricity of polymer crystals, such as polylactic acid, results from permanent dipoles with C=O bonds that are present in a helical axis direction. In particular, polylactic acid is an ideal polymer among polymers having helical chirality due to its low volume fraction of side chains with respect to a main chain, and its large proportion of permanent dipoles per volume.

It is known that the polylactic acid, which exhibits piezoelectricity by simply performing stretching, does not require a poling treatment and its piezoelectric modulus does not decrease over the years.

Since polylactic acids exhibit various piezoelectric properties as described above, piezoelectric polymer materials produced from various types of polylactic acids have been reported.

For example, a piezoelectric polymer material that exhibits a piezoelectric modulus of approximately 10 pC/N at room temperature, which is produced by stretching a molded product of polylactic acid, has been disclosed (e.g., see Japanese Patent Application Laid-Open No. 5-152638).

It has also been reported that a high piezoelectricity of approximately 18 pC/N can be achieved by carrying out a special orientation method, which is referred to as forging, in order to make polylactic acid crystals highly oriented (e.g., see Japanese Patent Application Laid-Open No. 2005-213376).

However, both piezoelectric materials shown in Japanese Patent Application Laid-Open No. 5-152638 and Japanese Patent Application Laid-Open No. 2005-213376 are insufficient in transparency.

SUMMARY OF THE INVENTION

A first aspect of the invention provides a piezoelectric polymer material comprising a helical chiral polymer having a weight average molecular weight of from 50,000 to 1,000,000 and optical activity, the piezoelectric polymer material having:

crystallinity as obtained by a DSC method of from 20% to 80%;

a transmission haze with respect to visible light of 50% or less; and a product of the crystallinity and a standardized molecular orientation MORc, which is measured with a microwave transmission-type molecular orientation meter at a reference thickness of 50 μm, of from 40 to 700.

A second aspect of the invention provides a piezoelectric polymer material comprising a polylactic acid-based polymer and polyvinylidene fluoride, wherein a content of the polyvinylidene fluoride is from more than 0 mass % to 5 mass % with respect to the total mass of the polylactic acid-based polymer, and wherein a piezoelectric constant $d_{14}$ measured by a resonance method at 25° C. is 10 pC/N or more.

DETAILED DESCRIPTION OF THE INVENTION

Figure 1:
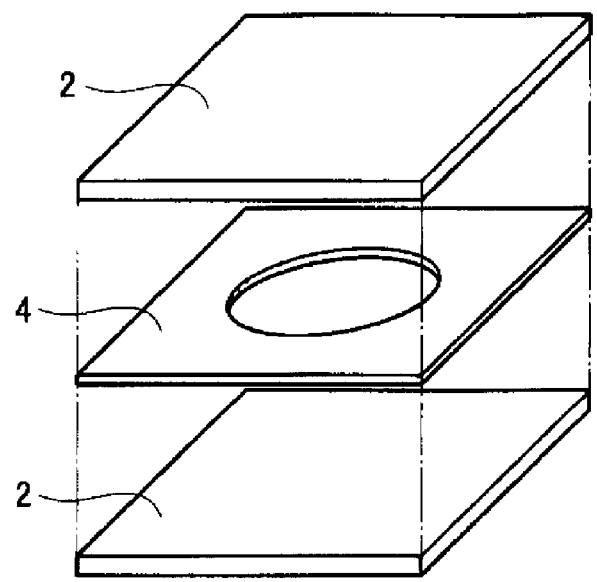
FIG. 1 is a schematic view illustrating the constitution of a heat press treatment used in the Examples in accordance with the first embodiment of the present invention.

According to the first embodiment of the present invention, it is possible to provide a piezoelectric polymer material that exhibits a high piezoelectric constant $d_{14}$ and excellent transparency and dimensional stability, and a method for producing the piezoelectric polymer material.

According to the second embodiment of the present invention, it is possible to provide a piezoelectric polymer material that exhibits a high piezoelectric constant $d_{14}$ and excellent transparency, and a method for producing the piezoelectric polymer material.

<Piezoelectric Polymer Material in Accordance with First Embodiment>

The piezoelectric polymer material in accordance with the first embodiment includes a helical chiral polymer having a weight average molecular weight of from 50,000 to 1,000,000 and optical activity, the piezoelectric polymer material having:

crystallinity as obtained by a DSC method of from 20% to 80%;

a transmission haze with respect to visible light of 50% or less; and a product of the crystallinity and a standardized molecular orientation MORc, which is measured with a microwave transmission-type molecular orientation meter at a reference thickness of 50 μm, of from 40 to 700.

By having the constitution as set forth above, a piezoelectric polymer material that exhibits a high piezoelectric constant $d_{14}$ and excellent transparency and dimensional stability can be obtained.

In the present specification, "piezoelectric constant $d_{14}$" refers to a kind of tensor of piezoelectric modulus, and in a case in which polarization occurs in a direction of shear stress upon application of a shear stress to a stretched material in a direction of stretching axis, the density of charges generated per unit shear stress is defined as $d_{14}$. The greater the value of piezoelectric constant $d_{14}$ is, the higher the piezoelectricity is.

In the present embodiment, the term "piezoelectric constant" refers to "piezoelectric constant $d_{14}$".

The piezoelectric constant $d_{14}$ is a value calculated by a method as described below. Specifically, a rectangular film whose longer side is at an angle of 45° with respect to a stretching direction is used as a test piece. Electrode layers are formed on the entire surface of front and back sides of a principal plane of the test piece, respectively. The amount of deformation of the film in the longer direction, which occurs upon application of a voltage E (V) to the electrodes, is defined as X. The value of $d_{14}$ is defined as 2× deformation X/electric field intensity E (V/m), in which the value obtained by dividing the applied voltage E (V) by a film thickness t (m) is given as an electric field intensity E (V/m) and the amount of deformation in the longitudinal direction of the film upon application of E (V) is given as X.

In addition, a complex piezoelectric modulus $d_{14}$ is calculated as $d_{14}=d_{14}'-id_{14}''$, and $d_{14}'$ and $id_{14}''$ are obtained by RHEOGRAPH SOLID S-1, manufactured by Toyo Seiki Seisaku-sho, Ltd. $d_{14}'$ represents the real part of the complex piezoelectric modulus, $id_{14}''$ represents the imaginary part of the complex piezoelectric modulus, and $d_{14}'$ (real part of the complex piezoelectric modulus) is equivalent to the piezoelectric constant $d_{14}$ in accordance with the present embodiment.

The greater the real part of the complex piezoelectric modulus is, the more favorable the piezoelectricity is.

There is a piezoelectric constant $d_{14}$ as measured by a displacement method (unit: pm/V) and a piezoelectric constant $d_{14}$ as measured by a resonance method (unit: pC/N).

In one aspect of the present embodiment, the piezoelectric constant $d_{14}$ as measured by a resonance method may be less than 10 pC/N.

[Helical Chiral Polymer Having Optical Activity]

The helical chiral polymer having optical activity refers to a polymer having a helical molecular structure and having molecular optical activity.

Helical chiral polymers having optical activity (hereinafter, also referred to as "optically active polymers") include, for example, polypeptides, cellulose derivatives, polylactic acid-based resins, polypropylene oxides, poly(β-hydroxybutyrate), and the like.

The polypeptides include, for example, poly(γ-benzyl glutarate), poly(γ-methyl glutarate), and the like.

The cellulose derivatives include, for example, cellulose acetate, cyanoethyl cellulose, and the like.

The optically active polymer preferably has an optical purity of 95.00% ee or more, more preferably 99.00% ee or more, and further preferably 99.99% ee or more, from the viewpoint of improving piezoelectricity of a piezoelectric polymer material. The optical purity is desirably 100.00% ee. When the optical purity of an optically active polymer is within the above-described range, it is considered that packing characteristics of polymer crystals that exhibit piezoelectricity is enhanced, thereby increasing piezoelectricity of the optically active polymer.

In the present embodiment, the optical purity of the optically active polymer is a value calculated by the following expression:

Optical purity(% ee)=100×|L-isomer amount−D-isomer amount|/(L-isomer amount+D-isomer amount)

In other words, a value obtained by multiplying the value obtained by dividing the difference (absolute value) between the amount [mass %] of L-isomer of optically active polymer and the amount [mass %] of D-isomer of optically active polymer by the total of the amount [mass %] of L-isomer of optically active polymer and the amount [mass %] of D-isomer of optically active polymer by 100 is referred to as optical purity.

The amount [mass %] of L-isomer of the optically active polymer and the amount [mass %] of D-isomer of the optically active polymer are obtained by high precision liquid chromatography (HPLC). Details of the measurement are described later.

Among the optically active polymers as described above, a compound having a main chain that contains a repeating unit represented by the following Formula (1) is preferred from the viewpoint of increasing optical purity and improving piezoelectricity.

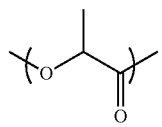

(1)

Exemplary compounds containing the repeating unit as a main chain represented by the Formula (1) include polylactic acid-based resins. In particular, polylactic acid is preferred, and a homopolymer of L-lactic acid (PLLA) or D-lactic acid (PDLA) is most preferred.

The polylactic acid-based resin refers to "polylactic acid," "copolymer of L- or D-lactic acid with a copolymerizable polyfunctional compound" or a mixture thereof.

The "polylactic acid" is a polymer in which lactic acids are polymerized via ester bonds to form a long structure, and it is known that polylactic acid can be produced by a lactide method in which a lactide is formed as an intermediate, a direct polymerization method in which lactic acid is heated in a solvent under reduced pressure to cause polymerization while removing water, or the like. Examples of polylactic acid include a homopolymer of L-lactic acid, a homopolymer of D-lactic acid, a block copolymer containing a polymers of at least one of L-lactic acid or D-lactic acid, and a graft copolymer containing a polymer of at least one of L-lactic acid or D-lactic acid.

Examples of the copolymerizable polyfunctional compound as described above include hydroxycarboxylic acids such as glycolic acid, dimethyl glycolate, 3-hydroxybutyrate, 4-hydroxybutyrate, 2-hydroxypropanoate, 3-hydroxypropanoate, 2-hydroxyvalerate, 3-hydroxyvalerate, 4-hydroxyvalerate, 5-hydroxyvalerate, 2-hydroxycaproate, 3-hydroxycaproate, 4-hydroxycaproate, 5-hydroxycaproate, 6-hydroxycaproate, 6-hydroxymethylcaproate and mandelic acid; cyclic esters such as glycolide, β-methyl-δ-valerolactone, γ-valerolactone and ε-caprolactone; polycarboxylic acids such as oxalic acid, malonic acid, succinic acid, glutaric acid, adipic acid, pimelic acid, azelaic acid, sebacic acid, undecanedioic acid, dodecanedioic acid and terephthalic acid; anhydrides of these compounds; polyhydric alcohols such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol and 1,4-hexanedimethanol; polysaccharides such as cellulose; aminocarboxylic acids such as α-amino acid; and the like.

Examples of the copolymer of lactic acid with a copolymerizable polyfunctional compound include a block or graft copolymer having a polylactic acid sequence that can generate helical crystals.

The polylactic acid-based resin can be produced, for example, by a method in which the resin is obtained by directly carrying out dehydrocondensation of lactic acid, as described in Japanese Patent Application Laid-Open No. 59-096123 and Japanese Patent Application Laid-Open No. 7-033861, a method in which a lactide, which is a cyclic dimer of lactic acid, is subjected to ring-opening polymerization, as described in U.S. Pat. Nos. 2,668,182 and 4,057,357, and the like.

In order that the optically active polymer obtained by a method as described above may have an optical purity of 95.00% ee or more, for example, when the polylactic acid is produced by a lactide method, it is preferable to use a lactide having an optical purity that has been increased to 95.00% ee or more by a crystallization operation for polymerization.

[Weight Average Molecular Weight of Optically Active Polymer]

The optically active polymer in accordance with the present embodiment may have a weight average molecular weight (Mw) of from 50,000 to 1,000,000.

If the lower limit of the weight average molecular weight of the optically active polymer is less than 50,000, mechanical strength of a molded product formed from the optically active polymer may be insufficient. The lower limit of the weight average molecular weight of the optically active polymer is preferably 100,000 or more, further preferably 200,000 or more. On the other hand, if the upper limit of the weight average molecular weight of the optically active polymer is more than 1,000,000, it may be difficult to form a molded product such as a film from the optically active polymer by carrying out extrusion or the like. The upper limit of the weight average molecular weight is preferably 800,000 or less, further preferably 300,000 or less.

The molecular weight distribution (Mw/Mn) of the optically active polymer is preferably from 1.1 to 5, more preferably from 1.2 to 4, from the viewpoint of the strength of the piezoelectric polymer material. The molecular weight distribution is further preferably from 1.4 to 3.

The weight average molecular weight Mw and the molecular weight distribution (Mw/Mn) of a polylactic acid-based polymer can be measured by a GPC measuring method as described below using a gel permeation chromatograph (GPC).

—GPC Measuring Apparatus—
GPC-100 manufactured by Waters Corporation
—Column—
SHODEX LF-804 manufactured by Showa Denko K.K.
—Preparation of Sample—
A polylactic acid-based polymer is dissolved in a solvent (e.g., chloroform) at 40° C. to prepare a sample solution with a concentration of 1 mg/ml.
—Measurement Conditions—
Into the column, 0.1 ml of the sample solution in the solvent (chloroform) is introduced at a temperature of 40° C. and a flow rate of 1 ml/min.

The concentration of the sample in the sample solution separated in the column is measured by a differential refractometer. A universal calibration curve is produced with a polystyrene standard sample, thereby calculating the weight average molecular weight (Mw) and the molecular weight distribution (Mw/Mn) of the polylactic acid-based polymer.

The polylactic acid-based polymer may be a commercially available polylactic acid, and examples thereof include PURASORB (PD, PL) manufactured by PURAC Corporation, LACEA (H-100, H-400) manufactured by Mitsui Chemicals Inc., and the like.

When a polylactic acid-based resin is used as the optically active polymer, in order to produce a polylactic acid-based resin having a weight average molecular weight (Mw) of 50,000 or more, it is preferable to produce the optically active polymer by a lactide method or a direct polymerization method.

[Polyvinylidene Fluoride]

The piezoelectric polymer material in accordance with the present embodiment may contain polyvinylidene fluoride at a rate of more than 0 mass % and 5 mass % or less with respect to the total mass of the polylactic acid-based polymer.

By including polyvinylidene fluoride together with the polylactic acid-based polymer, a piezoelectric polymer material having a high piezoelectric constant and excellent transparency can be obtained. It is considered that polyvinylidene fluoride functions as a crystal nucleating agent.

The weight average molecular weight (Mw) of the polyvinylidene fluoride is preferably from 3,000 to 1,000,000.

The mechanical strength of the piezoelectric polymer material is excellent when the lower limit of the weight average molecular weight is 3,000 or more, while it is easy to perform molding (such as extrusion) of the piezoelectric polymer material when the upper limit of the weight average molecular weight is 1,000,000 or less. The lower limit of the weight average molecular weight of the polyvinylidene fluoride is preferably 3,000 or more. The upper limit of the weight average molecular weight of the polyvinylidene fluoride is preferably 800,000 or less, further preferably 550,000 or less.

The molecular weight distribution (Mw/Mn) of the polyvinylidene fluoride is preferably from 1.1 to 5, more preferably from 1.2 to 4, from the viewpoint of strength and a degree of orientation of a stretched film. Further, the molecular weight distribution is preferably from 1.4 to 3.

The content of polyvinylidene fluoride is preferably more than 0 mass % and 5 mass % or less with respect to the total mass of the polylactic acid-based polymer. When the content of polyvinylidene fluoride is more than 5 mass %, the piezoelectric polymer material having excellent transparency may not be obtained. The content of polyvinylidene fluoride is preferably from 0.01 mass % to 5 mass %, more preferably from 0.05 mass % to 5 mass %, and further preferably from 0.1 mass % to 2.5 mass %, with respect to the total mass of the polylactic acid-based polymer, from the viewpoint of further increasing the piezoelectric constant.

A single type of polyvinylidene fluoride may be used alone, or two or more types having different weight average molecular weights Mw, molecular weight distributions (Mw/Mn) or glass transition temperatures Tg may be used in combination.

The weight average molecular weight (Mw) and the molecular weight distribution (Mw/Mn) of polyvinylidene fluoride can be measured by a GPC measuring method.

When the piezoelectric polymer material contains polyvinylidene fluoride, a piezoelectric constant $d_{14}$ measured at 25° C. by a resonance method, as described later, is preferably 10 pC/N or more.

[Other Components]

As necessary, the piezoelectric polymer material in accordance with the present embodiment may contain other components such as known resins including polyethylene and polystyrene resins, inorganic fillers such as silica, hydroxyapatite and montmorillonite, and known crystal nucleating agents such as phthalocyanine, in addition to the helical chiral polymer and optionally contained polyvinylidene fluoride, as long as the effects of the present embodiment are not undermined.

—Inorganic Filler—

In order to obtain a transparent film in which generation of voids such as bubbles is suppressed, an inorganic filler such as hydroxyapatite may be nano-dispersed in the piezoelectric polymer material, for example. However, in order to nano-disperse the inorganic filler, a large amount of energy is necessary to pulverize an aggregate of the inorganic filler. In addition, when the filler is not nano-dispersed, transparency of the film may deteriorate. When the piezoelectric polymer material in accordance with the present embodiment contains an inorganic filler, the content of the inorganic filler with respect to the total mass of the piezoelectric polymer material is preferably less than 1 mass %.

When the piezoelectric polymer material contains a component other than the helical chiral polymer, the content of the component other than the helical chiral polymer is preferably 20 mass % or less, more preferably 10 mass % or less, with respect to the total mass of the piezoelectric polymer material.

—Crystallization Promoting Agent (Crystal Nucleating Agent)—

The crystallization-promoting agent is not particularly limited as long as it can exert an effect of promoting crystallization, but it is desirable to select a substance having a crystalline structure whose lattice spacing is similar to that of the crystal lattice of polylactic acid. This is because a substance having a closer lattice spacing exerts a higher effect as a nucleating agent.

Examples of the crystallization promoting agent include zinc phenylsulfonate, melamine polyphosphate, melamine cyanurate, zinc phenylphosphonate, calcium phenylphosphonate and magnesium phenylphosphonate, which are organic substances, and talc and clay, which are inorganic substances.

Among them, zinc phenylphosphonate is preferred since it has a lattice spacing that is most similar to that of polylactic acid, and exerts an excellent effect of promoting formation of crystals. The crystallization promoting agent may be a commercially available product, and specific examples thereof include zinc phenylphosphonate ECOPROMOTE (manufactured by Nissan Chemical Industries, Ltd.); and the like.

The content of the crystal nucleating agent is usually from 0.01 to 1.0 part by weight, preferably from 0.01 to 0.5 parts by weight, and particularly preferably from 0.02 to 0.2 parts by weight, with respect to 100 parts by weight of the helical chiral polymer, from the viewpoint of achieving a higher crystal promotion effect and maintaining a degree of biomass. When the content of the crystal nucleating agent is less than 0.01 parts by weight, the crystal promotion effect may be insufficient, while when the content of the crystal nucleating agent is more than 1.0 part by weight, it may be difficult to control the rate of crystallization, thereby causing a decrease in transparency of the piezoelectric polymer material.

From the viewpoint of transparency, the piezoelectric polymer material preferably does not contain a component other than the helical chiral polymer.

[Structure]

As described later, the piezoelectric polymer material in accordance with the present embodiment has a structure in which molecules are oriented to a high degree. A molecular orientation ratio MOR is an index that indicates the orientation. The MOR (Molecular Orientation Ratio) is a value that indicates the degree of orientation of molecules, and is measured by a microwave measuring method as described below.

That is, a sample (film) is placed in the microwave resonance waveguide of a known apparatus for measuring a microwave molecular orientation ratio, in such a manner that a plane of the sample (film plane) is perpendicular to a direction in which microwaves travel. Then, while the sample is continuously irradiated with microwaves whose oscillation is in one direction, the sample is rotated at from 0 to 360° in a plane perpendicular to a direction of microwaves to travel, and the MOR is calculated by measuring the intensity of microwaves that had penetrated the sample.

The standardized molecular orientation MORc in accordance with the present embodiment is a value of MOR obtained at a reference thickness tc of 50 μm, and may be determined by the following expression:

$$MORc = (tc/t) \times (MOR - 1) + 1$$

(tc: reference thickness to be compensated; t: sample thickness)

The standardized molecular orientation MORc may be measured at a resonance frequency of around 4 GHz or 12 GHz by a known molecular orientation meter, such as a microwave-type molecular orientation meter MOA-2012A or MOA-6000, manufactured by Oji Scientific Instruments Co., Ltd.

The standardized molecular orientation MORc may be controlled by regulating the heat treatment conditions (heating temperature and heating time) prior to stretching a uniaxially stretched film, stretching conditions (stretching temperature and stretching rate), and the like, as described later.

<Production of Piezoelectric Polymer Material>

The piezoelectric polymer material in accordance with the present embodiment is obtained from a helical chiral polymer, such as the previously explained polylactic acid-based polymer, or from a mixture of a helical chiral polymer with other optional components.

The mixture is preferably melt-kneaded.

Specifically, for example, when two kinds of helical chiral polymers are mixed or when a helical chiral polymer is mixed with an inorganic filler or a crystal nucleating agent as described above, the helical chiral polymer to be mixed may be melt-kneaded at a mixer revolution rate of 30 rpm to 70 rpm and a temperature of from 180° C. to 250° C. for from 5 minutes to 20 minutes, with a melt-kneading machine (LABO PLASTOMILL MIXER, manufactured by Toyo Seiki Seisaku-sho, Ltd.), thereby obtaining a blend of plural kinds of helical chiral polymers or a blend of a helical chiral polymer with other components such as an inorganic filler.

<Methods for Producing Piezoelectric Polymer Material>
—First Method—

The piezoelectric polymer material in accordance with the present embodiment may be produced, for example, by a production method including a first step of heating a sheet in an amorphous state containing a helical chiral polymer to obtain a preliminarily crystallized sheet, and a second step of stretching the preliminarily crystallized sheet mainly in a uniaxial direction.

Generally, as a force applied to a film during stretching is increased, orientation of the helical chiral polymer is promoted and a piezoelectric constant is increased, whereby crystallization is promoted and the crystal size is increased. As a result, the degree of haze tends to be increased. Also, a dimension deformation rate tends to increase due to an increase in internal stress. When a force is simply applied to the film, crystals that are not oriented, such as spherulites, are formed. Crystals with low orientation, such as spherulites, are less likely to contribute to an increase in the piezoelectric constant, while increasing the haze. Therefore, in order to form a film that is high in piezoelectric constant but low in haze and dimension deformation rate, it is necessary to form oriented crystals that contribute to an increase in the piezoelectric constant, which crystals having a size that is small enough not to increase the haze, with high efficiency.

In the first method for producing the piezoelectric polymer material according to the present invention, for example, inside of a sheet is subjected to preliminary crystallization to form microscopic crystals, and then the sheet is stretched. In this way, a force can be efficiently applied to a polymer portion among microscopic crystals, in which crystallinity is low, whereby helical chiral polymers can be efficiently oriented in a main stretching direction. More specifically, while microscopic oriented crystals are generated in a polymer portion among microscopic crystals having low crystallinity, spherulites that have been generated during the preliminary crystallization are broken, and lamella crystals that form the spherulites are oriented in a stretching direction in the form of beads linked to tie molecular chains, whereby a desired value of MORc can be obtained. As a result, a sheet that is low in haze and dimension deformation rate can be obtained without greatly decreasing the piezoelectric constant.

In order to control the standardized molecular orientation MORc, it is important to regulate the time and the temperature for the heat treatment in the first step, and to regulate the rate and the temperature of stretching in the second step.

As previously described, the helical chiral polymer is a polymer that has a helical molecular structure and molecular optical activity, and the sheet that is in an amorphous state and contains the helical chiral polymer may be commercially obtained or may be prepared by a known film-molding means, such as extrusion molding. The sheet in an amorphous state may be single- or multi-layered.

[First Step (Preliminary Crystallization Step)]

The preliminarily crystallized sheet may be obtained by causing crystallization of a sheet that is in an amorphous state and contains a helical chiral polymer, by heating the sheet.

Specifically, 1) a sheet that has been obtained by crystallizing an amorphous sheet by heating the same may be subjected to the subsequent stretching step (second step) by setting the sheet to an stretching machine (off-line heat treatment), or 2) an amorphous sheet that has not been crystallized by heating may be set in a stretching machine, and then subjected to heating for preliminary crystallization and stretching (in-line heat treatment).

The heat treatment temperature T for carrying out preliminarily crystallization of the sheet that is in an amorphous state and contains a helical chiral polymer is not particularly limited. However, in order to improve piezoelectricity and transparency of a piezoelectric polymer material, the heat treatment temperature is preferably determined such that a relationship represented by the following expression is satisfied and the crystallinity is in a range of from 10 to 70%.

$$Tg \leq T \leq Tg+40° C.$$

(Tg represents the glass transition temperature of the helical chiral polymer material)

The heat treatment time for preliminary crystallization may be adjusted such that a desired crystallinity is achieved and the product of the standardized molecular orientation MORc of the piezoelectric polymer material after the stretching (after the second step) and the crystallinity of the piezoelectric polymer material after the stretching is preferably 40 or more, more preferably 75 or more, further preferably 100 or more, yet further preferably 120 or more. For example, the crystallinity of the piezoelectric polymer material after the stretching may be from 40 to 700, from 100 to 700, from 125 to 650, or from 250 to 350. If the heat treatment time is extended, crystallinity after the stretching is increased and the standardized molecular orientation MORc after the stretching is also increased. If the heat treatment time is shortened, crystallinity after the stretching is decreased and the standardized molecular orientation MORc after the stretching is also decreased.

When crystallinity of the preliminarily crystallized sheet prior to stretching is increased, the sheet becomes harder and a greater stretching stress is applied to the sheet, and therefore the orientation becomes stronger even in a region inside the sheet in which crystallinity is relatively low. As a result, the standardized molecular orientation MORc after the stretching is increased. Conversely, when the crystallinity of the preliminarily crystallized sheet prior to stretching is decreased, the sheet becomes softer and a smaller stretching stress is applied to the sheet, and therefore the orientation becomes weaker even in a region inside the sheet in which crystallinity is relatively low. As a result, the standardized molecular orientation MORc after the stretching is decreased.

The heat treatment time may vary depending on the heat treatment temperature, the thickness of a sheet, the molecular weight of a resin that forms the sheet, and the type or the amount of an additive or the like. In addition, when preheating is carried out prior to stretching (second step) at a temperature at which an amorphous sheet is crystallized, the time for heat treatment in which the sheet is substantially crystallized corresponds to the total of the preheating time and the heat treatment time for preliminary crystallization that is carried out prior to the preheating.

The time for carrying out heat treatment of a sheet that is in an amorphous state is typically from 5 seconds to 60 minutes, and may be from 1 minute to 30 minutes from the viewpoint of stabilizing the production conditions. For example, when a sheet in an amorphous state containing a polylactic resin as a helical chiral polymer is subjected to preliminary crystallization, the heating is preferably performed at from 60° C. to 170° C. for 5 seconds to 60 minutes, which may be from 1 minute to 30 minutes.

In order to efficiently provide the stretched sheet with piezoelectricity, transparency and high dimensional stability, it is important to adjust the crystallinity of the preliminarily crystallized sheet prior to stretching the same. The reason why piezoelectricity and dimensional stability are improved by stretching is considered to be that a stress created by stretching is concentrated on a region with a relatively high crystallinity of the preliminarily crystallized sheet, which region is presumed to be in a spherulite state, while the piezoelectric characteristic $d_{14}$ is increased as the spherulites are broken and oriented. In addition, a stretching stress is applied also to a region having relatively low crystallinity via the spherulites, whereby orientation is promoted and the piezoelectric characteristic $d_{14}$ is increased.

The crystallinity of the stretched sheet is preferably 20 or more, more preferably 25 or more, further preferably 30 or more, yet further preferably 40 or more. For example, the crystallinity of the stretched sheet may be from 20 to 80%, 40 to 80%, or from 40 to 70%. Therefore, the crystallinity of the preliminarily crystallized sheet immediately before the stretching is from 1 to 70%, preferably from 3 to 70%, more preferably from 10 to 60%, and further preferably from 15 to 50%.

The crystallinity of the preliminarily crystallized sheet can be measured in a similar manner to the measurement of crystallinity of the piezoelectric polymer material in accordance with the present embodiment after the stretching.

The thickness of the preliminarily crystallized sheet, which is determined mainly by the thickness and the stretching ratio of the piezoelectric polymer material which is to be obtained by the stretching in the second step, is preferably from 50 to 1,000 nm, more preferably from around 200 to 800 µm.

[Second Step (Stretching Step)]

The method of stretching in the stretching step, which corresponds to the second step, is not particularly limited, and various stretching methods such as uniaxial stretching, biaxial stretching, and solid-phase stretching as described later may be used.

By stretching a piezoelectric polymer material, a piezoelectric polymer material having a large principal plane can be obtained.

In the present specification, "principal plane" refers to a plane having a largest area among surfaces of a piezoelectric polymer material. The piezoelectric polymer material in accordance with the present embodiment may have two or more principal planes. For example, when the piezoelectric polymer material has a plate-like shape with two planes A of 10 mm×0.3 mm, two planes B of 3 mm×0.3 mm, and two planes C of 10 mm×3 mm, respectively, the principal planes of the piezoelectric polymer material are planes C, and the piezoelectric polymer material has two principal planes.

In the present embodiment, a principal plane having a large area refers to a principal plane having an area of 5 mm² or more, preferably 10 mm² or more.

In addition, "solid-phase stretching" refers to "stretching carried out at a temperature that is higher than the glass transition temperature Tg of the piezoelectric polymer material and is lower than the melting point Tm of the piezoelectric polymer material, and under a compressive stress of from 5 MPa to 10,000 MPa". Under these conditions, piezoelectricity of the piezoelectric polymer material can be further improved, and transparency and elasticity can be improved.

By subjecting a piezoelectric polymer material to solid-phase stretching or mainly uniaxial stretching, it is presumed that molecular chains of a polylactic acid-based polymer contained in the piezoelectric polymer material are oriented in one direction and aligned at high density, thereby achieving an even higher piezoelectricity.

In the present specification, the glass transition temperature Tg [° C.] of the piezoelectric polymer material and the melting point Tm [° C.] of the piezoelectric polymer material refer to a glass transition temperature (Tg) that is obtained as an inflection point, and a temperature (Tm) confirmed as a peak value in an endothermic reaction, respectively, from a melt endothermic curve obtained by increasing the temperature of the piezoelectric polymer material at a rate of 10° C./min with a differential scanning calorimeter (DSC).

The stretching temperature of the piezoelectric polymer material is preferably in a range higher than the glass transition temperature of the piezoelectric polymer material by approximately from 10° C. to 20° C., when the piezoelectric polymer material is stretched only by a tensile force, such as uniaxial stretching or biaxial stretching.

In the case of solid-phase stretching, the compressive stress is preferably from 50 MPa to 5,000 MPa, more preferably from 100 MPa to 3,000 MPa.

The stretching ratio during stretching is preferably from 3 times to 30 times, more preferably from 4 times to 15 times.

The solid-phase stretching of the preliminarily crystallized sheet is performed, for example, by pinching the piezoelectric polymer material between rolls or burettes and applying a pressure thereto.

When the preliminarily crystallized sheet is stretched, preheating may be performed immediately prior to performing stretching so that the sheet can be easily stretched. Since the preheating is performed generally for the purpose of softening the sheet prior to stretching the same to facilitate the stretching, it is usually performed under the conditions in which the sheet is not hardened by causing crystallization of the same. However, in the present embodiment, preliminary crystallization is performed prior to the stretching, as described above. Therefore, the preheating may be performed also as a process for preliminary crystallization. Specifically, the preheating can be performed also as the preliminary crystallization by carrying out the process at a higher temperature for a longer time in order to conform to the temperature and the time for preliminary crystallization, as compared with a temperature and a time that are ordinarily employed in the preheating process.

[Annealing Treatment]

From the viewpoint of improving the piezoelectric constant, it is preferred to subject a piezoelectric polymer material that has been stretched to a heat treatment (hereinafter, also referred to as an "annealing treatment").

The temperature for the annealing treatment is generally preferably from 80° C. to 160° C., further preferably from 100° C. to 155° C.

The method of temperature application in the annealing treatment is not particularly limited, and examples thereof include direct heating with a hot blast heater or an infrared heater, immersing the piezoelectric polymer material in a heated liquid such as heated silicone oil, and the like.

In this process, if deformation of the piezoelectric polymer material occurs due to linear expansion, it becomes difficult to produce a film that is flat in terms of practical use. Therefore, it is preferable to apply a temperature while applying a tensile stress (e.g., from 0.01 MPa to 100 Mpa) to the piezoelectric polymer material in order to prevent sagging of the piezoelectric polymer material.

The temperature application time during the annealing treatment is preferably from 1 second to 60 minutes, more preferably from 1 second to 300 seconds, further preferably from 1 second to 60 seconds. When the time for annealing is longer than 60 minutes, the orientation degree may decrease due to a growth of spherulites from molecular chains of an amorphous moiety at a higher temperature than the glass transition temperature of the piezoelectric polymer material, thereby causing deterioration in piezoelectricity.

The piezoelectric polymer material that has been subjected to the annealing treatment as described above is preferably quenched after the annealing treatment. In the annealing treatment, "quenching" refers to cooling the piezoelectric polymer material that has been subjected to the annealing treatment, to a temperature at least equal to or lower than the glass transition temperature Tg, by immersing the piezoelectric polymer material in ice water or the like immediately after the annealing treatment, without conducting any treatments between the annealing and the immersion.

Examples of the method for quenching include a method of immersing the piezoelectric polymer material that has been subjected to the annealing treatment in a refrigerant such as water, ice water, ethanol, ethanol or methanol in which dry ice is placed, or liquid nitrogen, and a method of spraying a liquid having a low vapor pressure to perform cooling by latent heat of vaporization. When it is desired to cool the piezoelectric polymer material in a serial manner, the piezoelectric polymer material can be rapidly cooled by contacting a metal roll having a temperature that is controlled to be not more than the glass transition temperature Tg of the piezoelectric polymer material.

The number of times of cooling may be only one or two or more. The annealing and the cooling may be alternately repeated.

—Second Method—

The piezoelectric polymer material in accordance with the present embodiment may be produced by a method including a step of stretching a sheet containing a helical chiral polymer mainly in a uniaxial direction, a step of carrying out annealing, and a hydrolysis step.

The step of stretching mainly in the uniaxial direction and the step of carrying out annealing are similar to the stretching step and the annealing step carried out in the first method, respectively, and explanation thereof will be omitted.

[Hydrolysis Step]

The hydrolysis step in accordance with the present embodiment is not particularly limited as long as it is a method in which the weight average molecular weight of the piezoelectric polymer material is decreased, and examples of the method include a method of immersing the piezoelectric polymer material in warm water, a method of treating the piezoelectric polymer material in a thermostat-humidistat bath under normal pressure, and a method of treating the piezoelectric polymer material with vapor at high temperature under high pressure. Ultrasonic waves or microwaves may be used for accelerating a hydrolysis reaction. A catalyst such as an acid, an alkali or an enzyme may also be used.

In the present embodiment, the number of times for performing stretching mainly in a uniaxial direction, annealing and hydrolysis, and the order of performing these steps, are not particularly limited. However, it is preferred to perform one or more cycles of performing stretching mainly in a uniaxial direction, annealing and hydrolysis, and then performing a further annealing.

The hydrolysis step may be performed before the first annealing step or after the first stretching step. In addition, the second stretching is not essential.

In the present embodiment, the weight average molecular weight of the piezoelectric polymer material is decreased during the hydrolysis step, and the degree of decrease is represented by a molecular weight remaining rate as defined by the following Expression (1). The molecular weight remaining rate is preferably 50% or more and less than 90%.

$$\text{Molecular weight remaining rate} = [Mw2/Mw1] \times 100 \, (\%) \quad \text{Expression (1)}$$

(Mw1 represents the weight average molecular weight of the piezoelectric polymer material prior to the hydrolysis treatment, and Mw2 represents the weight average molecular weight of the piezoelectric polymer material after the final annealing treatment.)

The weight average molecular weight of the piezoelectric polymer material is measured by a GPC measuring method, as described above.

In the present embodiment, it is presumed that by subjecting the piezoelectric polymer material to the step of stretching mainly in a uniaxial direction and the annealing step, molecular chains in the polylactic acid-based polymer contained in the piezoelectric polymer material are oriented in one direction, and oriented crystals that are aligned at high density are generated. Further, by performing hydrolysis, it is presumed that the molecular chains in an amorphous moiety remaining among the crystals are partially severed and untangled. As a result, it is presumed that a further growth of the oriented crystals is promoted during the subsequent stretching and annealing steps, and an even higher piezoelectricity can be obtained. It is further presumed that a portion with high crystallinity (a region that contributes to piezoelectricity) is highly resistant to hydrolysis and does not change significantly during hydrolysis, whereas a portion with low crystallinity (a region that does not contribute to piezoelectricity) is susceptible to hydrolysis, and thus is oriented by the treatment to contribute to piezoelectricity.

<Physical Properties of Piezoelectric Polymer Material>

The piezoelectric polymer material in accordance with the present embodiment has a high piezoelectric constant (piezoelectric constant $d_{14}$ measured by a displacement method at 25° C. of 1 pm/V or more), and exhibits excellent transparency and dimensional stability.

[Piezoelectric Constant (Displacement Method)]

In the present embodiment, the piezoelectric constant of the piezoelectric polymer material refers to a value measured by a method as described below.

The piezoelectric polymer material is cut into a size of 40 mm in a stretching direction (MD direction) and 40 mm in a direction perpendicular to the stretching direction (TD direction), respectively, thereby preparing a rectangular test piece.

The resultant test piece is set on a test bench of a sputtering thin film deposition system JSP-8000, manufactured by Ulvac, Inc., and the inside of a coater chamber is vacuumed with a rotary pump (for example, $10^{-3}$ Pa or less). Thereafter, sputtering is carried out on one face of the test piece for 500 seconds at an applied voltage of 280 V and a sputtering current of 0.4 A with an Ag (silver) target. Then, sputtering is carried out on the other face of the test piece under the same conditions for 500 seconds, thereby coating both faces of the test piece with Ag to form Ag conductive layers.

The test piece of 40 mm×40 mm having Ag conductive layers on both faces is cut in a size of 32 mm in a direction of 45° with respect to the stretching direction (MD direction) of the piezoelectric polymer material, and 5 mm in the direction perpendicular to the direction of 45°, thereby obtaining a rectangular film of 32 mm×5 mm. This was used as a sample for measuring the piezoelectric constant.

A difference distance between a maximal value and a minimum value of the displacement of the film, which occurred upon application of an alternating voltage of 10 Hz and 300 Vpp to the sample, was measured by a laser spectral-interference displacement meter SI-1000, manufactured by Keyence Corporation. The value obtained by dividing the measured displacement (mp-p) by the reference length of the film, which was 30 mm, was used as an amount of deformation, and a value obtained by multiplying a value, obtained by dividing the amount of deformation by an electric field intensity ((applied voltage (V))/(film thickness)) applied to the film, by 2, was used as the piezoelectric constant $d_{14}$.

A higher piezoelectric constant results in a greater displacement of the material with respect to a voltage applied to the piezoelectric polymer material, or conversely, a voltage generated with respect to a force applied to the piezoelectric polymer material, which is advantageous as a piezoelectric polymer material.

Specifically, the piezoelectric constant $d_{14}$ as measured by a displacement method at 25° C. is preferably 1 pm/V or more, more preferably 2 pm/V or more, further preferably 3 pm/V or more, yet further preferably 4 pm/V or more, yet further preferably 5 pm/V or more, yet further preferably 6 pm/V or more, and yet further preferably 8 pm/V or more.

The upper limit of the piezoelectric constant is not particularly limited, but is preferably 50 pm/V or less, and more preferably 30 pm/V or less, in the case of a piezoelectric material employing a helical chiral polymer, from the viewpoint of a balance with transparency as described below, etc.

[Crystallinity]

The crystallinity of the piezoelectric polymer material is determined by a DSC method, and the crystallinity of the piezoelectric polymer material in accordance with the present embodiment is preferably 20 or more, for example, from 25 to 80%, from 30 to 80%, from 40 to 80% or from 50 to 70%. If the crystallinity is within the range, the balance between piezoelectricity and transparency of the piezoelectric polymer material may be favorable, and whitening or breaking is less likely to occur during stretching, thereby facilitating the production of a piezoelectric polymer material.

[Transparency (Internal Haze)]

The transparency of the piezoelectric polymer material may be evaluated by, for example, visual observation or haze measurement. In piezoelectric polymer materials, the transmission haze with respect to visible light is preferably 50% or less, more preferably from 0.0% to 40%, further preferably 0.05 to 30%. In the present specification, the haze is a value as measured with a piezoelectric polymer material having a thickness of 0.05 mm at 25° C., using a haze meter (manufactured by Tokyo Denshoku Co., Ltd.; TC-HIII DPK) in accordance with JIS-K7105. Details of the measuring method are described in the Examples described later. The haze of the piezoelectric polymer material is preferably lower, but is preferably from 0.01% to 10%, further preferably from 0.1% to 5%, from the viewpoint of a balance with the piezoelectric constant and the like. The term "haze" or "transmission haze" in the present invention refers to an internal haze of the piezoelectric polymer material according to the present invention. The internal haze is a haze from which a haze that originates from the shape of an external surface of a piezoelectric polymer material is excluded, as described in the Examples below.

[Standardized Molecular Orientation MORc]

The piezoelectric polymer material in accordance with the present embodiment preferably has a standardized molecular orientation MORc of from 2 to 15.0, from 3.5 to 15.0, more preferably from 4.0 to 15.0, further preferably from 6.0 to 10.0, and further more preferably from 7 to 10.0. If the standardized molecular orientation MORc is in the range of from 2.0 to 15.0, more polylactic acid molecular chains are arranged in a stretching direction, whereby a rate of generation of oriented crystals can be increased and high piezoelectricity can be achieved.

[Product of Standardized Molecular Orientation MORc and Crystallinity]

The product of the crystallinity and the standardized molecular orientation MORc of the piezoelectric polymer material is preferably 40 or more, more preferably 75 or more, further preferably 100 or more, yet further preferably 120 or more. For example, the crystallinity may be from 40 to 700, from 125 to 650, or from 250 to 350. If the product of the crystallinity and the standardized molecular orientation MORc of the piezoelectric polymer material is in the range of 40 or more, the balance between piezoelectricity and transparency of the piezoelectric polymer material is favorable and the dimensional stability is high, whereby the piezoelectric polymer material can be suitably used as a piezoelectric element as described later.

Since the piezoelectric polymer material in accordance with the present embodiment is a piezoelectric material having a high piezoelectric constant $d_{14}$ and excellent transparency and dimensional stability, as described above, the piezoelectric polymer material can be used in various fields including speakers, headphones, microphones, hydrophones, ultrasonic transducers, ultrasonic application measurement instruments, piezoelectric vibrators, mechanical filters, piezoelectric transformers, delay apparatuses, sensors, acceleration sensors, shock sensors, vibration sensors, pressure-sensitive sensors, tactile sensors, electric field sensors, sound pressure sensors, displays, fans, pumps, variable focus mirrors, sound insulating materials, soundproof materials, keyboards, acoustic instruments, information processing machines, measuring instruments and medical instruments.

In that case, the piezoelectric polymer material in accordance with the present embodiment is preferably used as a piezoelectric element having at least two planes that are provided with an electrode. It is enough if the electrodes are provided to at least two planes of the piezoelectric polymer material. Materials for the electrodes are not particularly limited, and include, for example, ITO, ZnO, IZO (registered trademark), conductive polymers and the like.

In particular, when an electrode is provided on a principal plane of the piezoelectric polymer material, the electrode preferably has transparency. In the present specification, when the electrode has an internal haze of 20% or less (total light transmittance of 80% or more), the electrode is defined to have transparency.

The piezoelectric element formed from the piezoelectric polymer material in accordance with the present embodiment may be applied to the above-described various piezoelectric devices, such as the speakers and touch panels. In particular, a piezoelectric element provided with an electrode having transparency is suitably applied speakers, touch panels, actuators and the like.

<Piezoelectric Polymer Material in Accordance with the Second Embodiment>

The piezoelectric polymer material in accordance with the second embodiment is a piezoelectric polymer material including a polylactic acid-based polymer and polyvinylidene fluoride, wherein a content of the polyvinylidene fluoride is from more than 0 mass % to 5 mass % with respect to the total mass of the polylactic acid-based polymer, and wherein a piezoelectric constant $d_{14}$ measured by a resonance method at 25° C. is 10 pC/N or more.

The piezoelectric polymer material in accordance with the present embodiment may contain polyvinylidene fluoride at a rate of more than 0 mass % to 5 mass % with respect to the total mass of the polylactic acid-based polymer.

Since the piezoelectric polymer material contains polyvinylidene fluoride together with the polylactic acid-based polymer, it has a high piezoelectric constant and excellent transparency. It is presumed that polyvinylidene fluoride functions as a crystal nucleating agent.

The weight average molecular weight (Mw) of the polyvinylidene fluoride is preferably from 3,000 to 1,000,000.

When the lower limit of the weight average molecular weight is 3,000 or more, the piezoelectric polymer material exhibits excellent mechanical strength, and when the upper limit is 1,000,000 or less, molding (such as extrusion) of the piezoelectric polymer material becomes easy. The lower limit of the weight average molecular weight of polyvinylidene fluoride is preferably 3,000 or more. The upper limit of the weight average molecular weight of polyvinylidene fluoride is preferably 800,000 or less, further preferably 550,000 or less.

The molecular weight distribution (Mw/Mn) of polyvinylidene fluoride is preferably from 1.1 to 5, more preferably from 1.2 to 4, from the viewpoint of strength and orientation degree of a stretched film. The molecular weight distribution is preferably further preferably from 1.4 to 3.

The content of polyvinylidene fluoride is from more than 0 mass % to 5 mass % with respect to the total mass of the polylactic acid-based polymer. When the content is more than 5 mass %, the piezoelectric polymer material may not exhibit favorable transparency. The content is preferably from 0.01 mass % to 5 mass %, more preferably from 0.05 mass % to 5 mass %, and further preferably from 0.1 mass % to 2.5 mass %, with respect to the total mass of the polylactic acid-based polymer, from the viewpoint of further increasing the piezoelectric constant.

Only a single kind of polyvinylidene fluoride may be used, or two or more kinds having different weight average molecular weights Mw, molecular weight distributions (Mw/Mn) or glass transition temperatures Tg may be used in combination.

The weight average molecular weight (Mw) and the molecular weight distribution (Mw/Mn) of polyvinylidene fluoride can be measured by a GPC measuring method, as described above.

[Other Components]

The piezoelectric polymer material in accordance with the present embodiment may also contain other components such as known resins including polyethylene and polystyrene resins, inorganic compounds such as silica, hydroxyapatite and montmorillonite, and known crystal nucleating agents such as phthalocyanine, in addition to the polylactic acid-based polymers and polyvinylidene fluoride, as long as the effects of the present embodiment are not undermined.

—Inorganic Filler—

In order to obtain a transparent film in which generation of voids such as bubbles is suppressed, an inorganic filler such as hydroxyapatite may be nano-dispersed in the piezoelectric polymer material, for example. However, in order to nano-disperse the inorganic filler, a large amount of energy is necessary to pulverize an aggregate of the inorganic filler. In addition, when the filler is not nano-dispersed, transparency of the film may deteriorate. When the piezoelectric polymer material in accordance with the present embodiment contains an inorganic filler, the content of the inorganic filler with respect to the total mass of the piezoelectric polymer material is preferably less than 1 mass %.

When the piezoelectric polymer material contains a component other than the polylactic acid-based polymer and polyvinylidene fluoride, the content of the component other than the polylactic acid-based polymer and polyvinylidene fluoride is preferably 20 mass % or less, more preferably 10 mass % or less, with respect to the total mass of the piezoelectric polymer material.

The piezoelectric polymer material preferably does not contain components other than the polylactic acid-based polymer and polyvinylidene fluoride, from the viewpoint of a piezoelectric constant and transparency.

<Production of Piezoelectric Polymer Material>

The piezoelectric polymer material in accordance with this embodiment is obtained by mixing the polylactic acid-based polymer and polyvinylidene fluoride at a ratio as described above, and other components as necessary.

The mixture is preferably melt-kneaded.

Specifically, for example, a blend of the polylactic acid-based polymer and polyvinylidene fluoride can be obtained by melt-kneading with a melt-kneading machine [manufactured by Toyo Seiki Seisaku-sho, Ltd.; LABO PLASTOMILL MIXER] under the conditions of a mixer revolution speed of 30 rpm to 70 rpm and 180° C. to 250° C. for 5 minutes to 20 minutes.

<Molding of Piezoelectric Polymer Material>

The piezoelectric polymer material is preferably made into a molded product that has been subjected to a stretching treatment. The stretching method is not particularly limited, and various stretching methods such as uniaxial stretching, biaxial stretching, and solid-phase stretching as described later may be used.

By subjecting the piezoelectric polymer material to stretching, a piezoelectric polymer material having a large area of a principal plane can be obtained.

In the present specification, "principal plane" refers to a plane having a largest area among surfaces of a piezoelectric polymer material. The piezoelectric polymer material in accordance with the present embodiment may have two or more principal planes. For example, when the piezoelectric polymer material has a plate-like shape with two planes A of 10 mm×0.3 mm, two planes B of 3 mm×0.3 mm, and two planes C of 10 mm×3 mm, respectively, the principal planes of the piezoelectric polymer material are planes C, and the piezoelectric polymer material has two principal planes.

In the present embodiment, a principal plane having a large area refers to a principal plane having an area of 5 mm² or more, preferably 10 mm² or more.

In addition, "solid-phase stretching" refers to "stretching carried out at a temperature that is higher than the glass transition temperature Tg of the piezoelectric polymer material and is lower than the melting point Tm of the piezoelectric polymer material, and under a compressive stress of from 5 MPa to 10,000 MPa". Under these conditions, piezoelectricity of the piezoelectric polymer material can be further improved, and transparency and elasticity can be improved.

By subjecting a piezoelectric polymer material to solid-phase stretching, it is presumed that molecular chains of a polylactic acid-based polymer contained in the piezoelectric polymer material are oriented in one direction and aligned at high density, thereby achieving an even higher piezoelectricity.

In the present specification, the glass transition temperature Tg [° C.] of the piezoelectric polymer material and the melting point Tm [° C.] of the piezoelectric polymer material refer to a glass transition temperature (Tg) that is obtained as an inflection point, and a temperature (Tm) confirmed as a peak value in an endothermic reaction, respectively, from a melt endothermic curve obtained by increasing the temperature of the piezoelectric polymer material at a rate of 10° C./min with a differential scanning calorimeter (DSC).

The stretching temperature of the piezoelectric polymer material is preferably in a range higher than the glass transition temperature of the piezoelectric polymer material by approximately 10° C. to 20° C., when the piezoelectric polymer material is stretched only by a tensile force, such as uniaxial stretching or biaxial stretching.

The compressive stress is preferably from 50 MPa to 5,000 MPa, more preferably from 100 MPa to 3,000 MPa.

The stretching ratio during stretching is preferably from 3 times to 30 times, more preferably from 4 times to 15 times.

The stretching of the piezoelectric polymer material is performed by, for example, pinching the piezoelectric polymer material between rolls or burettes and applying a pressure thereto. When the stretching is carried out with burettes, it is preferred to preheat the piezoelectric polymer material to a temperature of from 60° C. to 170° C. for 1 minute to 60 minutes, prior to stretching the piezoelectric polymer material by applying a pressured to the piezoelectric polymer material pinched between the burettes.

The temperature of the heating treatment prior to stretching is preferably from 100° C. to 160° C., and the heating time is preferably from 5 minutes to 30 minutes.

From the viewpoint of improving the piezoelectric constant, it is preferred to subject a piezoelectric polymer material that has been stretched to a heat treatment (hereinafter, also referred to as an "annealing treatment").

The temperature for the annealing treatment is generally preferably from 80° C. to 160° C., further preferably from 100° C. to 155° C.

The method of temperature application in the annealing treatment is not particularly limited, and examples thereof include direct heating with a hot blast heater or an infrared heater, immersing the piezoelectric polymer material in a heated liquid such as heated silicone oil, and the like.

In this process, if deformation of the piezoelectric polymer material occurs due to linear expansion, it becomes difficult to produce a film that is flat in terms of practical use. Therefore, it is preferable to apply a temperature while applying a tensile stress (e.g., from 0.01 MPa to 100 Mpa) to the piezoelectric polymer material in order to prevent sagging of the piezoelectric polymer material.

The temperature application time during the annealing treatment is preferably from 1 second to 300 seconds, further preferably from 1 second to 60 seconds. When the time for annealing is longer than 300 seconds, the orientation degree may decrease due to a growth of spherulites from molecular chains of an amorphous moiety at a higher temperature than the glass transition temperature of the piezoelectric polymer material, thereby causing deterioration in piezoelectricity.

The piezoelectric polymer material that has been subjected to the annealing treatment as described above is preferably quenched after the annealing treatment. In the annealing treatment, "quenching" refers to cooling the piezoelectric polymer material that has been subjected to the annealing treatment, to a temperature at least equal to or lower than the glass transition temperature Tg, by immersing the piezoelectric polymer material in ice water or the like immediately after the annealing treatment, without conducting any treatments between the annealing and the immersion.

Examples of the method for quenching include a method of immersing the piezoelectric polymer material that has been subjected to the annealing treatment in a refrigerant such as water, ice water, ethanol, ethanol or methanol in which dry ice is placed, or liquid nitrogen, and a method of spraying a liquid having a low vapor pressure to perform cooling by latent heat of vaporization. When it is desired to cool the piezoelectric polymer material in a serial manner, the piezoelectric polymer material can be rapidly cooled by contacting a metal roll having a temperature that is controlled to be not more than the glass transition temperature Tg of the piezoelectric polymer material.

The number of times of cooling may be only one or two or more. The annealing and the cooling may be alternately repeated.

<Physical Properties of Piezoelectric Polymer Material>

The piezoelectric polymer material in accordance with the present embodiment has a high piezoelectric constant (piezoelectric constant $d_{14}$ as measured by a resonance method of 10 pC/N or more) and excellent transparency.

[Piezoelectric Constant (Resonance Method)]

In the present embodiment, the piezoelectric constant of the piezoelectric polymer material refers to a value measured as described below.

The piezoelectric polymer material is cut into a size of 32 mm in a stretching direction (MD direction) and 30 mm in a direction perpendicular to the stretching direction (TD direction), thereby preparing a rectangular test piece.

The resultant test piece is set on a test bench of QUICK COATER SC-701, manufactured by Sanyu Electron Co., Ltd., and the inside of a coater chamber is vacuumed (for example, $10^{-3}$ Pa or less) with a rotary pump. Thereafter, one face of the test piece is subjected to sputtering for 3 minutes with Au (gold) target at a sputtering current of 4 mA. Subsequently, the other face of the test piece is subjected to sputtering under the same conditions for 3 minutes, thereby forming an Au conductive layer on both faces of the test piece.

The test piece of 32 mm×30 mm, having Au conductive layers on both sides, is cut into a size of 10 mm in a stretching direction (MD direction) of the piezoelectric polymer material and 9 mm in a direction perpendicular to the stretching direction (TD direction). This is used as a sample for a resonance/anti-resonance method measurement.

A resonance curve of impedance that appears in a band region of from 50 kHz to 100 kHz is measured with an impedance analyzer HP4194A, manufactured by Yokogawa-Hewlett-Packard Company. From the obtained resonance curve of impedance and a relative dielectric constant $\in r$, a piezoelectric constant $d_{14}$ is calculated by a method described in Jpn. J. Appl. Phys. Vol. 37 (1998) pp. 3374-3376, part 1, No. 6A, June 1998.

The obtained piezoelectric constant is used as the piezoelectric constant of the piezoelectric polymer material.

The relative dielectric constant $\in_r$ is calculated by the following Expression (A) from a capacitance C [F] measured with an LCR meter HP4284A, manufactured by Hewlett-Packard Company, for the sample for resonance/anti-resonance method measurement.

$$\varepsilon_r = \frac{C \times d}{\varepsilon_0 \times S} \qquad \text{Expression (A)}$$

In the Expression (A), definitions of $\varepsilon_0$, C, d, $\varepsilon_r$ and S are as follows.

$\varepsilon_r$: relative dielectric constant of sample for resonance/anti-resonance method measurement C: capacitance [F] of sample for resonance/anti-resonance method measurement d: thickness [m] of sample for resonance/anti-resonance method measurement $\varepsilon_0$: dielectric constant of vacuum S: area [m$^2$] of sample for resonance/anti-resonance method measurement

[Transparency (Haze)]

The transparency of the piezoelectric polymer material may be evaluated by, for example, visual observation or haze measurement. In piezoelectric polymer materials, the haze is preferably 50 or less, more preferably from 0.0 to 40, further preferably from 0.05 to 30. In the present specification, the haze is a value as measured with a piezoelectric polymer material having a thickness of 0.05 mm at 25° C., using a haze meter (manufactured by Tokyo Denshoku Co., Ltd.; TC-HIII DPK) in accordance with JIS-K7105. Details of the measuring method are described in the Examples described later. The haze of the piezoelectric polymer material is preferably from 0.1 to 10, further preferably from 0.1 to 5.

Since the piezoelectric polymer material in accordance with the present embodiment is a piezoelectric material having a high piezoelectric constant $d_{14}$ and excellent transparency, as described above, the piezoelectric polymer material can be used in various fields including speakers, headphones, microphones, hydrophones, ultrasonic transducers, ultrasonic application measurement instruments, piezoelectric vibrators, mechanical filters, piezoelectric transformers, delay apparatuses, sensors, acceleration sensors, shock sensors, vibration sensors, pressure-sensitive sensors, tactile sensors, electric field sensors, sound pressure sensors, displays, fans, pumps, variable focus mirrors, sound insulating materials, soundproof materials, keyboards, acoustic instruments, information processing machines, measuring instruments and medical instruments.

In that case, the piezoelectric polymer material in accordance with the present embodiment is preferably used as a piezoelectric element having at least two planes provided with an electrode. It is enough if the electrodes are provided to at least two planes of the piezoelectric polymer material. Materials for the electrodes are not particularly limited, and include, for example, ITO, ZnO, IZO (registered trademark), conductive polymers and the like.

In particular, when an electrode is provided on a principal plane of the piezoelectric polymer material, the electrode preferably has transparency. In the present specification, when the electrode has an internal haze of 20 or less (total light transmittance of 80% or more), the electrode is defined to have transparency.

The piezoelectric element formed from the piezoelectric polymer material in accordance with the present embodiment may be applied to the above-described various piezoelectric devices, such as the speakers and touch panels. In particular, a piezoelectric element provided with an electrode having transparency is suitably applied speakers, touch panels, actuators and the like.

EXAMPLES

The embodiments of the present invention are further specifically described below with reference to the Examples, but the embodiments are not limited to the Examples.

First Embodiment

Example 1-1

A polylactic acid-based resin (registered trademark LACEA, H-400, weight average molecular weight Mw: 200,000, manufactured by Mitsui Chemicals, Inc.) was melt-kneaded at 230° C. with an extruder and extruded from a T-die to form a original sheet with a thickness of 300 μm, and the sheet was rolled with a cast roll having a surface temperature of 58° C.

Then, the original sheet was cut into a size of 7 cm in TD direction×13 cm in MD direction and sandwiched between two plates made of aluminum each having a size of 150 mm per side and a thickness of 0.15 mm, and heated at 90° C. for 2 minutes, and was subjected to preliminarily crystallization to produce a crystallized original sheet (preliminary crystallization step).

Then, two opposite ends of the crystallized original sheet were set to chucks of a tensile testing machine equipped with a constant-temperature bath. The film was 7 cm in width, and the distance between the chucks was 30 mm. Thereafter, the film surface temperature was increased from room temperature to a temperature of the constant-temperature bath, which was set at 80° C. Stretching was started at a stretching rate of 100 min/min immediately after the temperature reached 80° C., and the film was uniaxially stretched at a stretching ratio of 4.1 times, thereby obtaining a uniaxially stretched film with a thickness of 0.05 mm.

The uniaxially stretched film was sandwiched between two pieces of sandpaper of #1500, and the three-layer laminate was further sandwiched between two aluminum plates with a thickness of 0.15 mm to form a five-layer laminate. The laminate was placed in an envelope-shaped vacuum pack made of a polyimide film with a thickness of 50 μm, and the inside thereof was degassed with a vacuum pump until it is in a vacuum state. The vacuumed pack was inserted between an upper plate and a lower plate of a heat press whose temperature was set at 150° C., with a gap of 1 mm. Thereafter, an annealing treatment was performed for 10 minutes, thereby preparing a piezoelectric polymer material.

Examples 1-2 to 1-6, Comparative Example 1-1

Piezoelectric polymer materials of Examples 1-2 to 1-6 and Comparative Example 1-1 were prepared in the same manner as the piezoelectric polymer material of Example 1-1, except that the conditions for preliminary crystallization and stretching were changed as shown in Table 1.

Example 1-7

A piezoelectric polymer material was prepared in the same manner as Example 1-1, except that the raw material for the sheet was changed from the polylactic acid-based resin (registered trademark: LACEA H-400, weight average molecular weight Mw: 200,000, manufactured by Mitsui Chemicals, Inc.) to a mixture prepared by adding 0.1 parts by weight of zinc phenylphosphonate (ECOPROMOTE, manufactured by Nissan Chemical Industries, Ltd.) to 100 parts by weight of H-400.

Example 1-8, Example 1-9 and Comparative Examples 1-2 to 1-7

Piezoelectric polymer materials of Example 1-8, Example 1-9 and Comparative Examples 1-2 to 1-7 were prepared in the same manner as the piezoelectric polymer material of Example 1-7, except that the conditions for preliminary crystallization and stretching and the amount of crystal nucleating agent were changed as shown in Table 1.

—Measurement of Amounts of L- and D-Isomers of Resin (Optically Active Polymer)—

To a 50-mL conical flask, 1.0 g of the sample (piezoelectric polymer material) was weighed and placed, and 2.5 mL of IPA (isopropanol) and 5 mL of a 5.0 mol/L sodium hydroxide solution were added.

The conical flask containing the sample solution was placed in a water bath at a temperature of 40° C., and stirred for approximately 5 hours until polylactic acid was completely hydrolyzed.

The sample solution was cooled to room temperature, and neutralized by adding 20 mL of 1.0 mol/L hydrochloric acid solution. Then, the conical flask was stoppered and thoroughly stirred. HPLC sample solution 1 was prepared by placing 1.0 mL of the sample solution in a 25-mL measuring flask and adjusting to 25 mL with a mobile phase.

Into an HPLC apparatus, 5 μL of the HPLC sample solution 1 was injected, and the peak areas of the D/L-isomers of polylactic acid were determined under the following HPLC conditions. The amounts of the L- and D-isomers were calculated from the peak areas.

—HPLC Measurement Conditions—
Column
Optical resolution column, SUMICHIRAL OA5000, manufactured by Sumika Chemical Analysis Service, Ltd.
Measuring Apparatus
Liquid chromatography manufactured by JASCO Corporation
Column Temperature
25° C.
Mobile Phase
1.0 mM-copper (II) sulfate buffer/IPA=98/2 (V/V)
Copper (II) sulfate/IPA/water=156.4 mg/20 mL/980 mL
Mobile Phase Flow Rate
1.0 ml/min
Detector
Ultraviolet detector (UV 254 nm)
<Molecular Weight Distribution>

The molecular weight distribution (Mw/Mn) of a resin (optically active polymer), contained in each of the piezoelectric polymer materials of the Examples and the Comparative Examples, was measured by a GPC measuring method as described below.

—GPC Measuring Method—
Measuring Apparatus
GPC-100, manufactured by Waters Corporation
Column
SHODEX LF-804, manufactured by Showa Denko K.K.
Preparation of Sample Each of the piezoelectric polymer materials of the Examples and the Comparative Examples was dissolved in a solvent (chloroform) at 40° C. to prepare a sample solution with a concentration of 1 mg/ml.

Measurement Conditions

Into the column, 0.1 ml of the sample solution was introduced with a solvent (chloroform) at a temperature of 40° C. and a flow rate of 1 ml/min, and the concentration of the sample in the sample solution separated in the column was measured by a differential refractometer. The weight-average molecular weight (Mw) of the resin was calculated by producing a universal calibration curve with a polystyrene standard sample.

The results are shown in Table 1. In Table 1, "LA" represents LACEA H-400, and "EP" represents ECOPROMOTE. In addition, the amounts of the additive are in part(s) by weight with respect to 100 parts by weight of LACEA H-400.

TABLE 1(1)

| | Physical Properties of Resin | | | | Additive | | | Preliminary Crystallization | | Crystallized Original Sheet | Sheet |
|---|---|---|---|---|---|---|---|---|---|---|---|
| | Resin | Chirality | Mw | Mw/Mn | Optical Purity (%) | Type | Mw | Weight Parts (%) | Heat Temperature | Heating Time (min) | Degree of Crystallization (%) | Thickness t (μm) |
| Example 1-1 | LA | L | 200,000 | 2.87 | 98.5 | — | — | — | 90 | 2 | 17 | 300 |
| Example 1-2 | LA | L | 200,000 | 2.87 | 98.5 | — | — | — | 90 | 2 | 17 | 300 |
| Example 1-3 | LA | L | 200,000 | 2.87 | 98.5 | — | — | — | 90 | 2 | 17 | 300 |
| Example 1-4 | LA | L | 200,000 | 2.87 | 98.5 | — | — | — | 90 | 2 | 17 | 300 |
| Example 1-5 | LA | L | 200,000 | 2.87 | 98.5 | — | — | — | 75 | 0.2 | 5 | 150 |
| Example 1-6 | LA | L | 200,000 | 2.87 | 98.5 | — | — | — | 75 | 0.14 | 4 | 230 |
| Example 1-7 | LA | L | 200,000 | 2.87 | 98.5 | EP | — | 0.1 | 90 | 5 | 46 | 300 |
| Example 1-8 | LA | L | 200,000 | 2.87 | 98.5 | EP | — | 0.1 | 90 | 2 | 45 | 300 |
| Example 1-9 | LA | L | 200,000 | 2.87 | 98.5 | EP | — | 0.1 | 90 | 10 | 42 | 300 |
| Comp. Example 1-1 | LA | L | 200,000 | 2.87 | 98.5 | — | — | — | 90 | 2 | 17 | 300 |
| Comp. Example 1-2 | LA | L | 200,000 | 2.87 | 98.5 | EP | — | 0.5 | 90 | 2 | 40 | 300 |
| Comp. Example 1-3 | LA | L | 200,000 | 2.87 | 98.5 | EP | — | 0.5 | 90 | 5 | 41 | 300 |
| Comp. Example 1-4 | LA | L | 200,000 | 2.87 | 98.5 | EP | — | 0.5 | 90 | 30 | 41 | 300 |
| Comp. Example 1-5 | LA | L | 200,000 | 2.87 | 98.5 | EP | — | 1.0 | 90 | 2 | 41 | 300 |
| Comp. Example 1-6 | LA | L | 200,000 | 2.87 | 98.5 | EP | — | 1.0 | 90 | 5 | 40 | 300 |
| Comp. Example 1-7 | LA | L | 200,000 | 2.87 | 98.5 | EP | — | 1.0 | 90 | 10 | 44 | 300 |

TABLE 1(2)

| | | Stretching Conditions | | | | | Annealing Conditions | | |
|---|---|---|---|---|---|---|---|---|---|
| | Method | MD Direction Ratio | TD Direction Ratio | Stretch Rate (mm/min) | Temperature (° C.) | Area (mm²) | Temperature (° C.) | Time (sec) | Cooling Conditions |
| Example 1-1 | Uniaxial Stretching | 4.1 | 1.0 | 100 | 80 | 7900 | 150 | 600 | Rapid Cooling |
| Example 1-2 | Uniaxial Stretching | 4.1 | 1.0 | 500 | 80 | 7900 | 150 | 600 | Rapid Cooling |
| Example 1-3 | Uniaxial Stretching | 4.6 | 1.0 | 300 | 70 | 7900 | 150 | 600 | Rapid Cooling |
| Example 1-4 | Uniaxial Stretching | 4.6 | 1.0 | 200 | 80 | 7900 | 150 | 600 | Rapid Cooling |
| Example 1-5 | Uniaxial Stretching | 3.3 | 1.0 | | 70 | 500 mm in width | 120 | 30 | Rapid Cooling |
| Example 1-6 | Uniaxial Stretching | 3.5 | 1.5 | | 70 | 500 mm in width | 120 | 30 | Rapid Cooling |
| Example 1-7 | Uniaxial Stretching | 6.9 | 1.0 | 100 | 90 | 7900 | 150 | 600 | Rapid Cooling |
| Example 1-8 | Uniaxial Stretching | 6.0 | 1.0 | 500 | 70 | 7900 | 150 | 600 | Rapid Cooling |
| Example 1-9 | Uniaxial Stretching | 8.3 | 1.0 | 100 | 90 | 7900 | 150 | 600 | Rapid Cooling |
| Comp. Example 1-1 | Uniaxial Stretching | 4.4 | 1.0 | 500 | 70 | 7900 | 150 | 600 | Rapid Cooling |
| Comp. Example 1-2 | Uniaxial Stretching | 7.0 | 1.0 | 500 | 90 | 7900 | 150 | 600 | Rapid Cooling |
| Comp. Example 1-3 | Uniaxial Stretching | 6.0 | 1.0 | 30 | 80 | 7900 | 150 | 600 | Rapid Cooling |
| Comp. Example 1-4 | Uniaxial Stretching | 5.1 | 1.0 | 30 | 70 | 7900 | 150 | 600 | Rapid Cooling |
| Comp. Example 1-5 | Uniaxial Stretching | 7.7 | 1.0 | 100 | 90 | 7900 | 150 | 600 | Rapid Cooling |
| Comp. Example 1-6 | Uniaxial Stretching | 7.5 | 1.0 | 100 | 90 | 7900 | 150 | 600 | Rapid Cooling |
| Comp. Example 1-7 | Uniaxial Stretching | 6.5 | 1.0 | 100 | 80 | 7900 | 150 | 600 | Rapid Cooling |

<Measurement and Evaluation of Physical Properties>

The glass transition temperature Tg, melting point Tm, crystallinity, specific heat capacity Cp, thickness, haze, piezoelectric constant, MORc and dimensional stability of the piezoelectric polymer materials of Examples 1-1 to 1-9 and Comparative Examples 1-1 to 1-7, which were obtained in the process as described above, were measured. The results are shown in Table 2. In Table 2, the internal haze described as "0.0" is a value obtained by rounding to one decimal place.

Specifically, the physical properties were measured by the methods as described below.

[Glass Transition Temperature Tg, Melting Point Tm and Crystallinity]

Each of the piezoelectric polymer material of the Examples and the Comparative Examples was precisely weighed to 10 mg, and was measured with a differential scanning calorimeter (DSC-1 manufactured by PerkinElmer, Inc.) at a rate of temperature increase of 10° C./min, thereby obtaining a melt endothermic curve. The melting point Tm, the glass transition temperature Tg, the specific heat capacity Cp and the crystallinity were obtained from the obtained melt endothermic curve.

[Specific Heat Capacity Cp]

During the measurement with the above-described differential scanning calorimeter, the quantity of heat that is necessary for increasing the temperature by 1° C. per gram was measured. The measurement was performed under the same conditions as the measurement of Tg and Tm.

[Dimensional Stability]

The stretched film was cut into a size of 30 mm in a stretching direction (MD direction) and 6 mm in a direction perpendicular to the stretching direction (TD direction), thereby obtaining a rectangular film of 30 mm×6 mm. The rectangular film was sandwiched between two pieces of sandpaper of #1500, and the three-layer laminate was further sandwiched between two aluminum plates with a thickness of 0.15 mm, thereby preparing a five-layer laminate. The laminate was placed in an envelope-shaped vacuum pack made of a polyimide film with a thickness of 50 μm, and the inside thereof was degassed with a vacuum pump until it was in a vacuum state. The vacuumed polyimide envelope was inserted between an upper plate and a lower plate of a heat press, whose temperature was set at 150° C., with a gap of 1 mm. Then, an annealing treatment was performed for 10 minutes, and the dimensional stability was evaluated based on an absolute value of a rate of change in the film length (%) before and after the annealing.

[Internal Haze]

In the present specification, "Haze" or "transmission haze" refers to an internal haze of the piezoelectric polymer material according to the present invention, and is measured by an ordinary method. Specifically, the internal haze value of each of the piezoelectric polymer materials of the Examples and the Comparative Examples was measured as an optical transparency in a thickness direction with an apparatus described below, under the measurement conditions described below. The internal haze (hereinafter, also referred to as internal haze (H1)) of the piezoelectric polymer material according to the present invention was calculated from a haze (H2), which was measured by placing silicone oil (SHIN-ETSU SILICONE (trademark), manufactured by Shin-Etsu Chemical Co., Ltd., model number: KF96-100CS) between two glass place, and a haze (H3), which was measured by sandwiching a film having a surface uniformly wet with silicone oil with two glass plates, in accordance with the following expression.

Internal haze($H1$)=Haze($H3$)−Haze($H2$)

In order to calculate the internal haze (H1) of each of the piezoelectric polymer materials of the Examples and the Comparative Examples, the haze (H2) and the haze (H3) were obtained by measuring the optical transparency in a thickness direction with the following apparatus under the following conditions.

Measuring apparatus: HAZE METER TC-HIIIDPK, manufactured by Tokyo Denshoku Co., Ltd.

Sample size: 30 mm in width×30 mm in length, 0.05 mm in thickness

Measurement conditions: compliant with JIS-K7105

Measurement temperature: room temperature (25° C.)

[Piezoelectric Constant $d_{14}$ (Measured by Displacement Method)]

A test piece of 40 mm×40 mm having an Ag conductive layer on both faces was cut into a size of 32 mm in a direction of 45° with respect to a stretching direction (MD direction) of the piezoelectric polymer material and 5 mm in a direction perpendicular to the direction of 45° to a stretching direction, thereby preparing a rectangular film of 32 mm×5 mm. This was used as a sample for measurement of a piezoelectric constant.

An alternating voltage of 10 Hz and 300 Vpp was applied to the resultant film, and the difference in distance between a maximal value and a minimum value of displacement of the film was measured by a laser spectral-interference displacement meter (SI-1000, manufactured by Keyence Corporation).

The value obtained by dividing the measured amount of displacement (mp-p) by a reference length of the film (30 mm) was used as an amount of deformation. Then, the amount of deformation was divided by an electric field intensity ((applied voltage (V))/(film thickness)) applied to the film. The result was squared, and was used as a piezoelectric constant $d_{14}$ (pm/V).

[Standardized Molecular Orientation MORc]

The standardized molecular orientation MORc was measured by a microwave type molecular orientation meter (MOA-6000, manufactured by Oji Scientific Instruments Co., Ltd.) with a reference thickness tc of 50 μm.

Example 1-10

Production of Film A11 Prior to Stretching

Approximately 4 g of pellets of a resin having optical activity (polylactic acid-based resin, registered trademark: LACEA H-400, weight average molecular weight Mw: 200,000, manufactured by Mitsui Chemicals, Inc.) were weighed and placed between two SUS plates of 250 mm per side and a thickness of 5 mm, via an aluminum plate spacer of 0.15 mm in thickness and 250 mm per side, the spacer having a disk-shaped hole with a diameter of 150 mm. The assembly was pressed by hot plates whose temperature was set at 230° C. in a heat press (trademark: MINI TEST PRESS, manufactured by Toyo Seiki Seisaku-sho, Ltd.) at 5 MPa for 3 minutes (hereinafter, the treatment is referred to as "heat press treatment").

After the heat press treatment, the temperature was rapidly decreased to room temperature by an air-cooling fan while applying a pressure, whereby a disk-shaped unstretched film A11 having a diameter of 150 mm and a thickness of 150 μm was obtained.

TABLE 2(1)

|  | Tg (° C.) | Cp (J/g° C.) | Tm (° C.) | Crystallinity (%) | Thickness (mm) | MORc at 50 μm | Internal Haze (%) |
|---|---|---|---|---|---|---|---|
| Example 1-1 | 65.5 | 0.326 | 166.5 | 42.5 | 0.114 | 7.62 | 0.3 |
| Example 1-2 | 70.9 | 0.168 | 163.0 | 45.0 | 0.126 | 7.14 | 0.1 |
| Example 1-3 | 76.8 | 0.215 | 168.7 | 46.6 | 0.118 | 7.21 | 0.1 |
| Example 1-4 | 76.4 | 0.357 | 169.0 | 48.0 | 0.102 | 7.02 | 4.0 |
| Example 1-5 | — | — | 169.5 | 41.9 | 0.064 | 6.10 | 0.15 |
| Example 1-6 | 69.8 | — | 171.0 | 41.9 | 0.03 | 4.03 | 0.0 |
| Example 1-7 | 78.0 | 0.101 | 170.3 | 50.3 | 0.08 | 8.32 | 11.9 |
| Example 1-8 | 83.0 | 0.103 | 170.2 | 52.4 | 0.05 | 8.29 | 24.6 |
| Example 1-9 | 72.4 | 0.284 | 170.2 | 48.9 | 0.042 | 7.06 | 39.9 |
| Comp. Example 1-1 | 57.0 | 0.254 | 170.3 | 47.7 | 0.068 | 7.43 | 90.5 |
| Comp. Example 1-2 | 69.7 | 0.066 | 170.5 | 48.9 | 0.048 | 8.64 | 51.8 |
| Comp. Example 1-3 | 69.0 | 0.220 | 169.8 | 48.8 | 0.063 | 8.34 | 92.4 |
| Comp. Example 1-4 | 69.7 | 0.084 | 168.9 | 50.8 | 0.089 | 7.80 | 91.1 |
| Comp. Example 1-5 | 70.7 | 0.038 | 170.9 | 51.5 | 0.047 | 7.55 | 87.3 |
| Comp. Example 1-6 | 71.0 | 0.030 | 170.4 | 51.3 | 0.035 | 9.00 | 87.7 |
| Comp. Example 1-7 | 69.6 | 0.104 | 169.7 | 53.7 | 0.049 | 7.61 | 93.5 |

TABLE 2(2)

|  | Piezoelectric Constant (resonance method) (pC/N) | Piezoelectric Constant (displacement method) (pm/V) | MORc × Crystallinity | Length after Annealing (mm) | Ratio of Change in Dimension (%) | Thickness (mm) | Width (mm) |
|---|---|---|---|---|---|---|---|
| Example 1-1 | 10.6 | 8.6 | 324 | 28.98 | 3.40 | 0.095 | 5.99 |
| Example 1-2 | 10.5 | 8.4 | 321 | 29.43 | 1.90 | 0.125 | 5.79 |
| Example 1-3 | 10.5 | 8.3 | 336 | 28.77 | 4.10 | 0.104 | 5.87 |
| Example 1-4 | 10.2 | 8.1 | 337 | 27.99 | 6.70 | 0.114 | 5.94 |
| Example 1-5 | 9.5 | 6.93 | 255.6 | 29.4 | 1.90 | — | — |
| Example 1-6 | 6.3 | 4.18 | 168.9 | 28.5 | 5.00 | — | — |
| Example 1-7 | 11.6 | 9.5 | 419 | 28.85 | 3.83 | 0.066 | 5.91 |
| Example 1-8 | 11.9 | 9.9 | 434 | 28.69 | 4.37 | 0.135 | 5.58 |
| Example 1-9 | 10.5 | 8.4 | 345 | 26.81 | 10.63 | 0.073 | 5.71 |
| Comp. Example 1-1 | 10.8 | 8.7 | 354 | 29.19 | 2.70 | 0.121 | 6.00 |
| Comp. Example 1-2 | 10.4 | 8.3 | 423 | 24.92 | 16.93 | 0.116 | 6.42 |
| Comp. Example 1-3 | 9.9 | 7.7 | 407 | 25.04 | 16.53 | 0.146 | 6.43 |
| Comp. Example 1-4 | 9.1 | 6.8 | 396 | 25.68 | 14.40 | 0.078 | 6.29 |
| Comp. Example 1-5 | 10.7 | 8.6 | 388 | 26.67 | 11.10 | 0.087 | 6.21 |
| Comp. Example 1-6 | 10.6 | 8.4 | 462 | 27.11 | 9.63 | 0.069 | 5.85 |
| Comp. Example 1-7 | 10.9 | 8.8 | 409 | 27.62 | 7.93 | 0.068 | 6.08 |

Specific means for obtaining the disk-shaped sheet of polylactic acid is explained with reference to the drawings.

Figure 2:
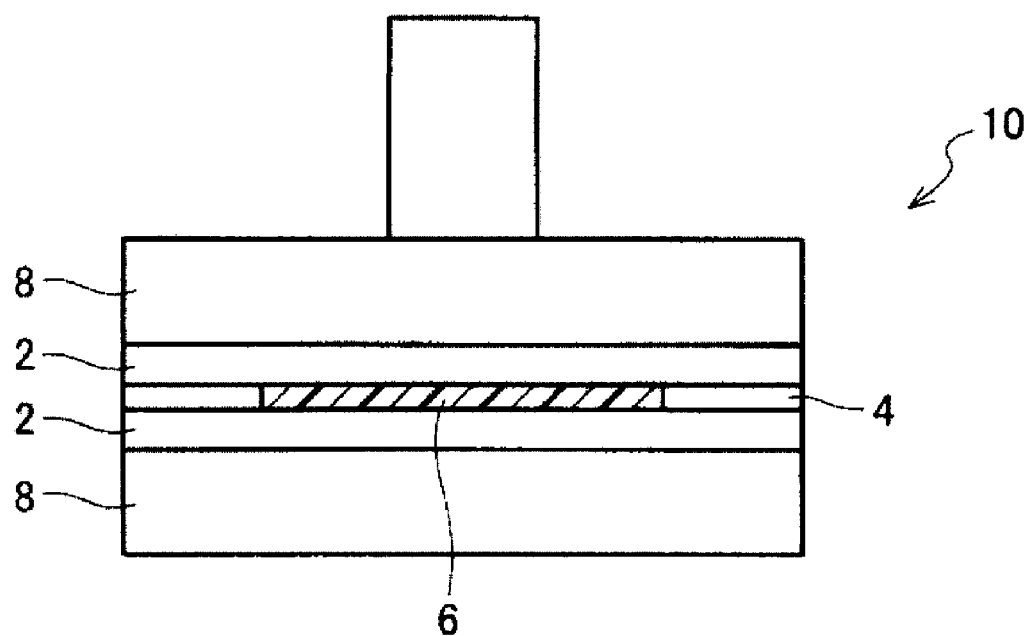
FIG. 2 is a schematic view illustrating the constitution of a heat press machine used in the Examples in accordance with the first embodiment of the present invention.

FIG. 1 illustrates a schematic view (perspective view) of a heat press treatment in which the spacer 4 is sandwiched between the two SUS plates 2. FIG. 2 illustrates a schematic view (side cross-sectional view) of a heat and pressure-application apparatus (heat press machine) 10 in a state of pressing, with hot plates, the polylactic acid pellets 6 that are sandwiched between the two SUS plates 2.

In FIG. 1, the spacer 4 is an aluminum plate of 0.15 mm in thickness and 250 mm per side, having a disk-shaped hole with a diameter of 150 mm in the center. The SUS plates 2 are made of stainless steel and have a size of 250 mm per side and 5 mm in thickness.

The polylactic acid pellets 6 were placed in the hole of the spacer 4, and were sandwiched with the SUS plates 2.

The SUS plates 2, between which the spacer 4 and the polylactic acid pellets 6 were sandwiched, were further sandwiched between the hot plates 8 and pressed by the heat press machine 10, as illustrated in FIG. 2.

—Uniaxial Stretching Treatment (1)—

In order to perform uniaxial stretching, a rectangular film A12 with a width of 100 mm and a length of 50 mm was cut from the heat-pressed unstretched film A11.

The film was set in POLYMER FILM X AND Y-AXIS STRETCHING SYSTEM SS-60, manufactured by Shibayama Scientific Co., Ltd.), and portions of 1 cm from the edges in a 100-mm longer direction of the film A12 were fixed with chucks, in such a manner that the shape of the film before the stretching was substantially 100 mm in width and 30 mm in length. The temperature inside the system was set at 70° C., and immediately after the temperature inside the system and the surface temperature of the film reached 70° C., the stretching operation was performed.

The film A12 was stretched under the conditions of a temperature inside the system of 70° C., a stretching ratio of 5 times, and a stretching rate of 30 mm/min.

—Annealing Treatment (1)—

In order to perform an annealing treatment, the temperature inside the apparatus was set at 150° C. while chucking the film A12 in the apparatus, and the temperature was maintained at 150° C. Thereafter, the film was sprayed with a cooling spray (134aQREI, manufactured by Sunhayato Corp.) to cool to the glass transition temperature or lower.

A film A13, which had been annealed and stretched at a ratio of 5 times and had the size of 50 mm in width, 150 mm in length, 0.06 mm in thickness and 7,200 mm² in area, was thus obtained.

—Hydrolysis Treatment (1)—

In order to perform hydrolysis, a rectangular film A14 of 45 mm in width and 90 mm in length was cut from the film A13 that had been subjected to the first annealing treatment.

The film was set to a fixation instrument for uniaxial stretching. Portions of 1 cm from the edges in a 90-mm longer direction of the film A14 were fixed with chucks, in such a manner that the size of the film before being stretched was substantially 45 mm in width and 70 mm in length. The film was then subjected to a hydrolysis treatment by immersing in warm water at 90° C. for 1 hour together with the fixation instrument.

—Uniaxial Stretching Treatment (2)—

Subsequently, the second uniaxial stretching treatment was performed in warm water at 90° C. at a stretch ratio of 1.05 times and a stretching rate of 30 mm/min.

—Annealing Treatment (2)—

In order to perform an annealing treatment, the uniaxially stretched film was placed in a hot air dryer set at 150° C., together with the fixation instrument, and was left to stand for 1 hour. Thereafter, the film was cooled to the glass transition temperature or lower with a cooling spray (134aQREI, manufactured by Sunhayato Corp.)

The uniaxial stretching treatment at a stretching ratio of 1.05 times and the annealing treatment were conducted four times, respectively, thereby producing a piezoelectric polymer material 1-10 of Example 1-10 that had been stretched at a stretch ratio of 6.1 times.

Example 1-11

A rectangular film was obtained in the same manner as Example 1-10, except that the film was cut from a film that had been annealed and stretched at a stretching ratio of 8 times, and the film was set to a fixation instrument for uniaxial stretching.

A piezoelectric polymer material 1-11 of Example 1-11, which was stretched at a stretching ratio of 8.4 times, was produced in the same manner as Example 1-10, except that the film was immersed in warm water at 90° C. for 4 hours, instead of immersing in warm water for 1 hour.

<Measurement and Evaluation of Physical Properties>

The weight average molecular weight, melting point Tm, crystallinity, thickness, haze (internal haze), piezoelectric constant and MORc of the piezoelectric polymer materials of Examples 1-10 and 1-11 were measured. The results are shown in Table 4.

Specifically, they were measured as described below.

<Weight Average Molecular Weight>

The weight average molecular weight before the hydrolysis treatment (Mw1) and the weight average molecular weight after the final annealing treatment (Mw2) in the Examples and the Comparative Examples were measured by a GPC measuring method as described below. In addition, a molecular weight remaining rate was defined and calculated by the following Expression (1):

$$\text{Molecular weight remaining rate} = [Mw2/Mw1] \times 100 \ (\%) \qquad \text{Expression (1)}$$

—GPC Measuring Method—

Measuring Apparatus

GPC-100, manufactured by Waters Corporation

Column

SHODEX LF-804, manufactured by Showa Denko K.K.

Preparation of Sample

Each of the piezoelectric polymer materials of the Examples and the Comparative Examples was dissolved in a solvent (chloroform) at 25° C. to prepare a sample solution with a concentration of 1 mg/ml.

Measurement Conditions

Into the column, 0.1 ml of the sample solution was introduced with a solvent (chloroform) at a temperature of 40° C. and a flow rate of 1 ml/min, and the concentration of the sample in the sample solution separated in the column was measured by a differential refractometer. The weight-average molecular weight (Mw) of the resin was calculated by producing a universal calibration curve with a polystyrene standard sample.

The results are show in Table 4.

[Melting Point Tm and Crystallinity]

Each of the piezoelectric polymer materials of the Examples and the Comparative Examples was precisely weighed to 5 mg, and was measured with a differential scanning calorimeter (DSC-1 manufactured by PerkinElmer, Inc.) at a rate of temperature increase of 10° C./min, thereby obtaining a melt endothermic curve. The melting point Tm, the glass transition temperature Tg and the crystallinity were obtained from the obtained melt endothermic curve.

[Haze (Internal Haze)]

In the present specification, "Haze" or "transmission haze" refers to an internal haze of the piezoelectric polymer material according to the present invention, and is measured by an ordinary method. Specifically, the internal haze value of each of the piezoelectric polymer materials of the Examples and the Comparative Examples was measured as an optical transparency in a thickness direction with an apparatus described below, under the measurement conditions described below. The internal haze (hereinafter, also referred to as internal haze (H1)) of the piezoelectric polymer material according to the present invention was calculated from a haze (H2), which was measured by placing silicone oil (SHIN-ETSU SILICONE (trademark), manufactured by Shin-Etsu Chemical Co., Ltd., model number: KF96-100CS) between two glass plates, and a haze (H3), which was measured by sandwiching a film having a surface uniformly wet with silicone oil with two glass plates, in accordance with the following expression.

Internal haze($H1$)=Haze($H3$)−Haze($H2$)

In order to calculate the internal haze (H1) of each of the piezoelectric polymer materials of the Examples and the Comparative Examples, the haze (H2) and the haze (H3) were obtained by measuring the optical transparency in a thickness direction with the following apparatus under the following conditions.

Measuring apparatus: HAZE METER TC-HIIIDPK, manufactured by Tokyo Denshoku Co., Ltd.

Sample size: 30 mm in width×30 mm in length, 0.05 mm in thickness

Measurement conditions: compliant with JIS-K7105

Measurement temperature: room temperature (25° C.)

[Piezoelectric Constant $d_{14}$ (Measured by Displacement Method)]

A test piece was prepared by cutting each of the piezoelectric polymer material of Examples 1-10 and 1-11 into a size of 1 cm in length and 3 mm in width.

The complex piezoelectric modulus $d_{14}$ of the obtained test piece was measured with RHEOLOGRAPH SOLID S-1, manufactured by Toyo Seiki Seisaku-sho, Ltd. at a frequency of 10 Hz at room temperature. The complex piezoelectric modulus $d_{14}$ was calculated by the expression $d_{14}=d_{14}'-d_{14}''$. The measurement of piezoelectric constant was carried out five times, and an average value of $d_{14}'$ is shown in Table 4 as the piezoelectric modulus.

The shear strain during the measurement of piezoelectric constant was set at 0.05%.

[Standardized Molecular Orientation MORc]

The standardized molecular orientation MORc was measured by a microwave type molecular orientation meter (MOA-6000, manufactured by Oji Scientific Instruments Co., Ltd.) with a reference thickness tc of 50 μm.

TABLE 3

| | Uniaxial Stretching Conditions (1) | | Annealing Conditions (1) | | Hydrolysis/Stretching Conditions | | | | | | | |
|---|---|---|---|---|---|---|---|---|---|---|---|---|
| | Ratio | Temperature (° C.) | Temperature (° C.) | Time (H) | Treatment Apparatus | Temperature (° C.) | Time (H) | Stretching Ratio | Stretching Temperature (° C.) | Annealing Temperature (° C.) | Annealing Time (H) | Number of Repetitions | Total Stretching Ratio |
| Example 1-10 | 5.0 | 70 | 150 | 1 | Water Bath | 90 | 1 | 1.05 | 90 | 150 | 1 | 4 | 6.1 |
| Example 1-11 | 8.0 | 70 | 150 | 1 | Water Bath | 90 | 4 | 1.05 | 90 | 150 | 1 | 4 | 8.4 |

TABLE 4

| | Weight Average Molecular Weight | | Molecular Weight Remaining Rate | Tm (° C.) | Crystallinity (%) | Thickness (mm) | MORc at 50 μm | MORc x Crystallinity | Internal Haze (%) | Piezoelectric Constant $d_{14}$ (pm/V) |
|---|---|---|---|---|---|---|---|---|---|---|
| | Mw1 Before Hydrolysis | Mw2 After Final Annealing | | | | | | | | |
| Example 1-10 | 216,000 | 122,000 | 56.4 | 166.3 | 60.2 | 0.057 | 6.9 | 415.4 | 0.9 | 9.5 |
| Example 1-11 | 207,000 | 158,000 | 76.3 | 167 | 62.7 | 0.035 | 7.8 | 489.1 | 0.5 | 11.8 |

Second Embodiment

Comparative Example 2-1

Production of Blend

Pellets of polylactic acid H-400 (registered trademark: LACEA, weight average molecular weight Mw: 240,000, manufactured by Mitsui Chemicals Inc.) were used as a polylactic acid-based polymer, and pellets of polyvinylidene fluoride (weight average molecular weight Mw: 530,000, manufactured by Sigma-Aldrich Corporation) were used as polyvinylidene fluoride.

Polylactic acid H-400 (90 parts by mass) and polyvinylidene fluoride (10 parts by mass) were melt-kneaded for 10 minutes at a mixer revolution speed of 50 rpm at 210° C. with a melt-kneading machine (manufactured by Toyo Seiki Seisaku-sho, Ltd.; LABO PLASTOMILL MIXER), thereby obtaining a blend of polylactic acid and polyvinylidene fluoride (blend 101).

—Production of Unstretched Film—

4 g of the blend 1 were weighed and sandwiched between two SUS plates of 250 mm per side and 5 mm in thickness via a spacer made of an aluminum plate of 0.15 mm in thickness and 250 mm per side, having a disk-shaped hole with a diameter of 150 mm in the center, and a pressure of 5MPa was applied thereto for 3 minutes with hot plates whose temperature was set at 210° C. in a heat press (trademark: MINI TEST PRESS, manufactured by Toyo Seiki Seisaku-sho, Ltd.) (the treatment is referred to as "heat press treatment").

After the heat press treatment, the temperature was rapidly returned to room temperature with an air-cooling fan while applying pressure, thereby obtaining a disk-shaped unstretched film A1 having a diameter of 150 mm and a thickness of 150 µm.

—Uniaxial Stretching—

In order to perform uniaxial stretching, a rectangular film A2 with a width of 100 mm and a length of 50 mm was cut from the heat-pressed unstretched film A1.

The film A2 was set in POLYMER FILM X AND Y-AXIS STRETCHING SYSTEM SS-60, manufactured by Shibayama Scientific Co., Ltd., and the temperature inside the system was set at 70° C. Immediately after the temperature reached 70° C., the stretching operation was performed.

The film A2 was stretched at a temperature inside the system (stretching temperature) of 70° C., a stretching ratio of 6 times, and a stretching rate of 30 mm/min, whereby a film A3 was obtained.

—Annealing Treatment—

In order to perform an annealing treatment, the temperature inside the system was set at 150° C., while the film A3 was kept in the stretching system, and the temperature was maintained at 150° C. for 10 minutes. Thereafter, the film was sprayed with a cooling spray (134aQREI, manufactured by Sunhayato Corp.) to cool to the glass transition temperature or lower.

A piezoelectric polymer material 101 of Comparative Example 2-1 was thus produced.

Example 2-1 to Example 2-11 and Comparative Example 2-2 to Comparative Example 2-4

Blends 1-8 and 102-104 were produced in the same manner as the blend 101 of Comparative Example 2-1, except that polylactic acid (PLA) and polyvinylidene fluoride (PVDF) were changed to those shown in Table 5.

Subsequently, piezoelectric polymer materials 1-11 and 102-104 of Example 2-1 to Example 2-11 and Comparative Example 2-2 to Comparative Example 2-4 were produced in the same manner as the piezoelectric polymer material 101 of Comparative Example 2-1, except that the blends shown in Table 5 were used and the stretching conditions were changed to those shown in Table 5.

In Table 5, "H-400 crosslinked" in the column "PLA" refers to a polymer obtained by mixing 99.6 parts by mass of polylactic acid H-400 (registered trademark LACEA; weight average molecular weight Mw: 240,000, manufactured by Mitsui Chemicals Inc.) with 0.4 parts by mass of a crosslinking agent (manufactured by NOF Corporation; organic peroxide PH25B) under 210° C., and is a compound containing a repeating unit represented by Formula (1) as a main chain.

The melting points Tm of the polyvinylidene fluorides used in the Examples were as follows:

PVDF (Mw: 530,000) . . . Tm: 171° C.
PVDF (Mw: 280,000) . . . Tm: 170° C.
PVDF (Mw: 180,000) . . . Tm: 172° C.

Comparative Example 2-5

A piezoelectric polymer material 105 of Comparative Example 2-1 was produced in the same manner as the piezoelectric polymer material 101 in Comparative Example 2-1, except that only polylactic acid H-400 (registered trademark: LACEA, manufactured by Mitsui Chemicals Inc., weight average molecular weight Mw: 200,000) was used instead of the blend 101.

Comparative Example 2-6

A piezoelectric polymer material 106 of Comparative Example 2-6 was produced in the same manner as the piezoelectric polymer material 101 in Comparative Example 2-1, except that only polyvinylidene fluoride (weight average molecular weight Mw: 180,000, manufactured by Sigma-Aldrich Corporation) was used instead of the blend 101.

Comparative Example 2-7

A blend 105 was produced in the same manner as the blend 7 for the piezoelectric polymer material 9 of Example 2-9, except that acetylcellulose (number average molecular weight Mn: 30,000, manufactured by Sigma-Aldrich Corporation) was used instead of polyvinylidene fluoride (weight average molecular weight Mw: 180,000, manufactured by Sigma-Aldrich Corporation).

Subsequently, a piezoelectric polymer material 107 of Comparative Example 2-7 was produced in the same manner as the piezoelectric polymer material 101 of Comparative Example 2-1, except that the blend 105 was used instead of the blend 101.

In Table 5, "0.50%*" described in the column "mass ratio PLA/PVDF" indicates a mass ratio of PLA/acetylcellulose, and "99.5:0.5*" described in the column "mass ratio PLA: PVDF" indicates a mass ratio of PLA:acetylcellulose.

<Measurement and Evaluation of Physical Properties>

The glass transition temperature Tg, melting point Tm, crystallinity, piezoelectric constant, standardized molecular orientation MORc and dimensional change rate of the piezoelectric polymer materials 1-11 of Examples 2-1 to 2-11 and the piezoelectric polymer materials 101-107 of Comparative Examples 2-1 to 2-7, obtained in the processes as described above, were measured. The results are shown in Table 6.

Specifically, the measurements were conducted in accordance with the following processes.

[Glass Transition Temperature Tg, Melting Point Tm and Crystallinity]

Each of the piezoelectric polymer materials of the Examples and the Comparative Examples was precisely weighed to 10 mg, and a melt endothermic curve was obtained therefrom with a differential scanning calorimeter (DSC-1, manufactured by PerkinElmer, Inc.) at a temperature increase rate of 10° C./min. The melting point Tm, the glass transition temperature Tg and the crystallinity were obtained from the obtained melt endothermic curve.

[Transparency (Internal Haze)]

Transparency of the piezoelectric polymer materials of Examples 2-1 to 2-11 and the piezoelectric polymer materials of Comparative Examples 2-1 to 2-7 was evaluated by measuring a haze value (internal hazes) of the piezoelectric polymer materials. The internal haze (hereinafter, also referred to as internal haze (H1)) of the piezoelectric polymer material according to the present invention was calculated from a haze (H2), which was measured by placing silicone oil (SHIN-ETSU SILICONE (trademark), manufactured by Shin-Etsu Chemical Co., Ltd., model number: KF96-100CS) between two glass place, and a haze (H3), which was measured by sandwiching a film having a surface uniformly wet with silicone oil with two glass plates, in accordance with the following expression.

Internal haze($H1$)=Haze($H3$)−Haze($H2$)

In order to calculate the internal haze (H1) of each of the piezoelectric polymer materials of the Examples and the Comparative Examples, the haze (H2) and the haze (H3) were obtained by measuring the optical transparency in a thickness direction with the following apparatus under the following conditions.

Measuring apparatus: HAZE METER TC-HIIIDPK, manufactured by Tokyo Denshoku Co., Ltd.

Sample size: 30 mm in width×30 mm in length, 0.05 mm in thickness

Measurement conditions: compliant with JIS-K7105

Measurement temperature: room temperature (25° C.)

Evaluation was carried out in accordance with the following evaluation criteria based on the degree of the obtained haze value (internal haze).

—Evaluation Criteria—

A: Haze value (internal haze) is 6% or less.
B: Haze value (internal haze) is from more than 6% to 40%.
C: Haze value (internal haze) is more than 40%.

[Piezoelectric Constant (Measured by Resonance Method)]

Each of the piezoelectric polymer materials of the Examples and the Comparative Examples was cut into a size of 32 mm in a stretching direction (MD direction) and 30 mm in a direction perpendicular to the stretching direction (TD direction), thereby preparing a rectangular test piece.

The resultant test piece was set on a test bench of QUICK COATER SC-701, manufactured by Sanyu Electron Co., Ltd., and the inside of a coater chamber was vacuumed (for example, $10^{-3}$ Pa or less) with a rotary pump.

Thereafter, one face of the test piece was subjected to sputtering for 3 minutes with Au (gold) target at a sputtering current of 4 mA. Subsequently, the other face of the test piece was subjected to sputtering under the same conditions for 3 minutes, thereby forming an Au conductive layer on both faces of the test piece.

The test piece of 32 mm×30 mm, having Au conductive layers on both sides, was cut into a size of 10 mm in a stretching direction (MD direction) of the piezoelectric polymer material and 9 mm in a direction perpendicular to the stretching direction (TD direction). This was used as a sample for a resonance/anti-resonance method measurement.

A resonance curve of impedance that appears in a band region of from 50 kHz to 100 kHz was measured with an impedance analyzer HP4194A, manufactured by Yokogawa-Hewlett-Packard Company. From the obtained resonance curve of impedance and a relative dielectric constant Er, a piezoelectric constant $d_{14}$ was calculated by a method described in Jpn. J. Appl. Phys. Vol. 37 (1998) pp. 3374-3376, part 1, No. 6A, June 1998.

The obtained piezoelectric constant was used as the piezoelectric constant of the piezoelectric polymer material.

The relative dielectric constant $\in_r$ was calculated by the Expression (A) as described above from a capacitance C [F] measured with an LCR meter HP4284A, manufactured by Hewlett-Packard Company, for the sample for resonance/anti-resonance method measurement.

[Dimensional Stability]

The stretched film was cut into a size of 30 mm in a stretching direction (MD direction) and 6 mm in a direction perpendicular to the stretching direction (TD direction), thereby obtaining a rectangular film of 30 mm×6 mm. The rectangular film was sandwiched between two pieces of sandpaper of #1500, and the three-layer laminate was further sandwiched between two aluminum plates with a thickness of 0.15 mm, thereby preparing a five-layer laminate. The laminate was placed in an envelope-shaped vacuum pack made of a polyimide film with a thickness of 50 μm, and the inside thereof was degassed with a vacuum pump until it was in a vacuum state. The vacuumed polyimide envelope was inserted between an upper plate and a lower plate of a heat press, whose temperature was set at 150° C., with a gap of 1 mm. Then, an annealing treatment was performed for 10 minutes, and the dimensional stability was evaluated based on an absolute value of a rate of change in the film length (%) before and after the annealing.

[Standardized Molecular Orientation MORc]

The standardized molecular orientation MORc was measured by a microwave type molecular orientation meter (MOA-6000, manufactured by Oji Scientific Instruments Co., Ltd.) with a reference thickness tc of 50 μm.

TABLE 5(1)

| | Composition and Conditions of Production of Piezoelectric Polymer Material | | | | | | |
|---|---|---|---|---|---|---|---|
| | Polymer 1 | Polymer 2 | | Mass Ratio | | | Crystallized |
| | PLA Type | Type | Mw | PVDF/PLA | PLA:PVDF | Blend No. | Original Sheet |
| Example 2-1 | H-400 | PVDF | 530,000 | 2.56% | 97.5:2.5 | 1 | 150 |
| Example 2-2 | H-400 | PVDF | 530,000 | 1.01% | 99:1 | 2 | 150 |
| Example 2-3 | H-400 | PVDF | 280,000 | 2.56% | 97.5:2.5 | 3 | 150 |
| Example 2-4 | H-400 | PVDF | 280,000 | 1.01% | 99:1 | 4 | 150 |
| Example 2-5 | H-400 | PVDF | 280,000 | 1.01% | 99:1 | 4 | 150 |
| Example 2-6 | H-400 | PVDF | 280,000 | 2.56% | 97.5:2.5 | 5 | 150 |
| Example 2-7 | H-400 | PVDF | 180,000 | 1.01% | 99:1 | 6 | 150 |
| Example 2-8 | H-400 | PVDF | 180,000 | 1.01% | 99:1 | 6 | 150 |
| Example 2-9 | H-400 | PVDF | 180,000 | 0.50% | 99.5:0.5 | 7 | 150 |
| Example 2-10 | H-400 Crosslinked | PVDF | 180,000 | 1.01% | 99:1 | 8 | 150 |
| Example 2-11 | H-400 Crosslinked | PVDF | 180,000 | 1.01% | 99:1 | 8 | 150 |
| Comp. Example 2-1 | H-400 | PVDF | 530,000 | 11.10% | 90:10 | 101 | 150 |
| Comp. Example 2-2 | H-400 | PVDF | 530,000 | 5.26% | 95:5 | 102 | 150 |
| Comp. Example 2-3 | H-400 | PVDF | 280,000 | 5.26% | 95:5 | 103 | 150 |
| Comp. Example 2-4 | H-400 | PVDF | 180,000 | 5.26% | 95:5 | 104 | 150 |
| Comp. Example 2-5 | H-400 | Not used | — | 0.00% | 100:0 | — | 150 |
| Comp. Example 2-6 | Not used | PVDF | 180,000 | — | 1:100 | — | 150 |
| Comp. Example 2-7 | H-400 | Cellulose | — | 0.50%* | 99.5:05* | 105 | 150 |

TABLE 5(2)

Composition and Conditions of Production of Piezoelectric Polymer Material

| | Conditions for Stretching | | | | | Conditions for Annealing | | |
|---|---|---|---|---|---|---|---|---|
| | Method | Temperature (°C.) | Ratio | Stretching Rate (mm/min) | Area (mm$^2$) | Temperature (°C.) | Time (sec) | Conditions for Cooling |
| Example 2-1 | Uniaxial Stretching | 70° C. | 6 times | 30 | 7900 | 150 | 600 | Rapid Cooling |
| Example 2-2 | Uniaxial Stretching | 70° C. | 6 times | 30 | 7900 | 150 | 600 | Rapid Cooling |
| Example 2-3 | Uniaxial Stretching | 70° C. | 6 times | 30 | 7900 | 150 | 600 | Rapid Cooling |
| Example 2-4 | Uniaxial Stretching | 70° C. | 6 times | 30 | 7900 | 150 | 600 | Rapid Cooling |
| Example 2-5 | Uniaxial Stretching | 80° C. | 6 times | 30 | 7900 | 150 | 600 | Rapid Cooling |
| Example 2-6 | Uniaxial Stretching | 70° C. | 6 times | 30 | 7900 | 150 | 600 | Rapid Cooling |
| Example 2-7 | Uniaxial Stretching | 70° C. | 6 times | 30 | 7900 | 150 | 600 | Rapid Cooling |
| Example 2-8 | Uniaxial Stretching | 80° C. | 6 times | 30 | 7900 | 150 | 600 | Rapid Cooling |
| Example 2-9 | Uniaxial Stretching | 70° C. | 6 times | 30 | 7900 | 150 | 600 | Rapid Cooling |
| Example 2-10 | Uniaxial Stretching | 70° C. | 6 times | 30 | 7900 | 150 | 600 | Rapid Cooling |
| Example 2-11 | Uniaxial Stretching | 75° C. | 6 times | 30 | 7900 | 150 | 600 | Rapid Cooling |
| Comp. Example 2-1 | Uniaxial Stretching | 70° C. | 6 times | 30 | 7900 | 150 | 600 | Rapid Cooling |
| Comp. Example 2-2 | Uniaxial Stretching | 70° C. | 6 times | 30 | 7900 | 150 | 600 | Rapid Cooling |
| Comp. Example 2-3 | Uniaxial Stretching | 70° C. | 6 times | 30 | 7900 | 150 | 600 | Rapid Cooling |
| Comp. Example 2-4 | Uniaxial Stretching | 70° C. | 6 times | 30 | 7900 | 150 | 600 | Rapid Cooling |
| Comp. Example 2-5 | Uniaxial Stretching | 70° C. | 6 times | 30 | 7900 | 150 | 600 | Rapid Cooling |
| Comp. Example 2-6 | Uniaxial Stretching | 160° C. | 6 times | 30 | 7900 | 150 | 600 | Rapid Cooling |
| Comp. Example 2-7 | Uniaxial Stretching | 70° C. | 6 times | 30 | 7900 | 150 | 600 | Rapid Cooling |

TABLE 6(1)

| | Evaluation | | | | | |
|---|---|---|---|---|---|---|
| | Tg (°C.) | Tm (°C.) | Crystallinity (%) | Transparency | MORc at 50 μm | Internal Haze (%) |
| Example 2-1 | 69.6 | 166.5 | 47.2 | B | 5.4 | |
| Example 2-2 | 69.3 | 167.1 | 45.8 | A | 5.3 | 0.9 |
| Example 2-3 | 68.3 | 167.3 | 43.9 | B | | |
| Example 2-4 | 70.5 | 168.8 | 48.0 | A | 5.4 | 0.9 |
| Example 2-5 | 69.5 | 170.6 | 54.1 | A | 5.7 | 3.4 |
| Example 2-6 | 68.0 | 169.5 | 44.0 | B | 5.3 | |
| Example 2-7 | 70.6 | 170.3 | 47.5 | A | 5.4 | 0.9 |
| Example 2-8 | 69.7 | 170.1 | 50.6 | A | 5.5 | 0.9 |
| Example 2-9 | 66.3 | 169.9 | 55.6 | A | 5.7 | 0.9 |
| Example 2-10 | 67.5 | 167.6 | 50.9 | A | 6.4 | 0.7 |
| Example 2-11 | 69.5 | 168.8 | 55.2 | A | 5.6 | 0.7 |
| Comp. Example 2-1 | 62.5 | 167.3 | 45.2 | C | 5.3 | |
| Comp. Example 2-2 | 69.1 | 167.6 | 48.2 | C | 5.4 | |
| Comp. Example 2-3 | 68.3 | 167.6 | 42.2 | C | | |
| Comp. Example 2-4 | 71.4 | 169.3 | 47.9 | C | 5.4 | |
| Comp. Example 2-5 | 57.0 | 157.8 | 64.0 | A | 6.0 | 0.3 |
| Comp. Example 2-6 | — | 171.8 | — | C | | |
| Comp. Example 2-7 | 66.0 | 168.0 | 49.5 | C | 5.5 | |

TABLE 6(2)

| | Evaluation | | | | |
|---|---|---|---|---|---|
| | Piezoelectric Constant (resonance method) (pC/N) | Piezoelectric Constant (displacement method) (pmN) | MORc × Crystallinity | Length after Annealing (mm) | Ratio of Change in Dimension (%) |
| Example 2-1 | 11.0 | 8.10 | 254.9 | | 2.3 |
| Example 2-2 | 12.0 | 9.20 | 244.6 | 37 | 3.2 |
| Example 2-3 | 11.0 | 8.10 | | | 2.1 |
| Example 2-4 | 11.0 | 8.10 | 260.5 | | 4.2 |
| Example 2-5 | 11.0 | 8.10 | 310.5 | 35.7 | 3.5 |
| Example 2-6 | 11.0 | 8.10 | 232.9 | | 2.7 |
| Example 2-7 | 12.0 | 9.20 | 257 | | 3.3 |
| Example 2-8 | 11.0 | 8.10 | 279.1 | | 2.2 |
| Example 2-9 | 13.0 | 10.30 | 318.4 | | 1.3 |

TABLE 6(2)-continued

|  | Evaluation | | | | |
| --- | --- | --- | --- | --- | --- |
|  | Piezoelectric Constant (resonance method) (pC/N) | Piezoelectric Constant (displacement method) (pmN) | MORc × Crystallinity | Length after Annealing (mm) | Ratio of Change in Dimension (%) |
| Example 2-10 | 12.0 | 9.20 | 327.9 | 50 | 2.2 |
| Example 2-11 | 12.0 | 9.20 | 307.9 | 3.7 | 1.8 |
| Comp. Example 2-1 | 10.0 | 7.00 | 241.1 |  | 2.2 |
| Comp. Example 2-2 | 11.0 | 8.10 | 262 |  | 1.9 |
| Comp. Example 2-3 | 10.0 | 7.00 |  |  | 2.5 |
| Comp. Example 2-4 | 11.0 | 8.10 | 259.8 |  | 2.1 |
| Comp. Example 2-5 | 9.0 | 5.90 | 382.1 |  | 1.8 |
| Comp. Example 2-6 |  |  | 0 |  | 2.5 |
| Comp. Example 2-7 | 10.0 | 7.00 | 271.2 |  | 2.3 |

All of the piezoelectric polymer materials of the Examples in Table 6 exhibited excellent transparency and a large piezoelectric constant as measured by a resonance method of 11 pC/N or more.

All publications, patent applications, and technical standards mentioned in this specification are herein incorporated by reference to the same extent as if each individual publication, patent application, or technical standard was specifically and individually indicated to be incorporated by reference.

What is claimed is:

1. A piezoelectric polymer material comprising a helical chiral polymer having a weight average molecular weight of from 50,000 to 1,000,000 and optical activity, the piezoelectric polymer material having:
    crystallinity as obtained by a DSC method of from 20% to 80%;
    a transmission haze with respect to visible light of 10% or less; and
    a product of the crystallinity and a standardized molecular orientation MORc, which is measured with a microwave transmission-type molecular orientation meter at a reference thickness of 50 pm, of from 40 to 700.

2. The piezoelectric polymer material according to claim 1, wherein the MORc is from 2.0 to 15.0.

3. The piezoelectric polymer material according to claim 1, wherein the transmission haze with respect to visible light is from 0.01% to 10%, and the MORc is from 6.0 to 10.0.

4. The piezoelectric polymer material according to claim 1, wherein a piezoelectric constant $d_{14}$ measured by a displacement method at 25° C. is 1 pm/V or more.

5. The piezoelectric polymer material according to claim 1, wherein the helical chiral polymer is a polylactic acid-based polymer having a main chain containing a repeating unit represented by the following Formula (1):

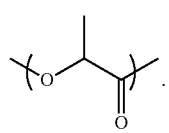

(1)

6. The piezoelectric polymer material according to claim 1, wherein the helical chiral polymer has an optical purity of 95.00% ee or more.

7. The piezoelectric polymer material according to claim 5, further comprising polyvinylidene fluoride, wherein
    a content of the polyvinylidene fluoride is from more than 0 mass % to 5 mass % with respect to the total mass of the polylactic acid-based polymer; and
    a piezoelectric constant $d_{14}$ measured by a resonance method at 25° C. is 10 pC/N or more.

8. The piezoelectric polymer material according to claim 7, wherein the content of the polyvinylidene fluoride is from 0.01 mass % to 5 mass % with respect to the total mass of the polylactic acid-based polymer.

9. The piezoelectric polymer material according to claim 7, wherein a weight average molecular weight of the polyvinylidene fluoride is from 3,000 to 800,000.

10. The piezoelectric polymer material according to claim 1, comprising from 0.01 to 1.0 part by weight of a crystal nucleating agent with respect to 100 parts by weight of the helical chiral polymer contained in the piezoelectric polymer material.

11. The piezoelectric polymer material according to claim 10, wherein the crystal nucleating agent is at least one compound selected from the group consisting of zinc phenylsulfonate, melamine polyphosphate, melamine cyanurate, zinc phenylphosphonate, calcium phenylphosphonate, magnesium phenylphosphonate, talc and clay.

12. The piezoelectric polymer material according to claim 1, wherein an area of a principal plane is 5 mm² or more.

13. A method for producing the piezoelectric polymer material according to claim 1, the method comprising:
    obtaining a preliminarily crystallized sheet by heating a sheet that is in an amorphous state and contains a helical chiral polymer; and
    stretching the preliminarily crystallized sheet mainly in a uniaxial direction.

14. The method for producing the piezoelectric polymer material according to claim 13, wherein in the obtaining of the preliminarily crystallized sheet, the sheet in an amorphous state is heated to have a crystallinity of from 10% to 70% at a temperature T represented by the following expression:

$Tg \leq T \leq Tg+40°$ C.

wherein Tg represents the glass transformation temperature of the helical chiral polymer material.

15. The method for producing the piezoelectric polymer material according to claim 13, wherein in the obtaining of the preliminarily crystallized sheet, the sheet in an amorphous state comprises polylactic acid as the helical chiral polymer and is heated at from 60° C. to 170° C. for from 5 seconds to 60 minutes.

16. The method for producing the piezoelectric polymer material according to claim 13, wherein an annealing treatment is performed after the stretching.

17. A method for producing the piezoelectric polymer material according to claim 1, the method comprising:
    stretching a sheet that contains a helical chiral polymer mainly in a uniaxial direction; and
    performing a hydrolysis treatment after the stretching.

18. A piezoelectric polymer material comprising a polylactic acid-based polymer and polyvinylidene fluoride, wherein a content of the polyvinylidene fluoride is from more than 0 mass % to 5 mass % with respect to the total mass of the polylactic acid-based polymer, and wherein a piezoelectric constant $d_{14}$ measured by a resonance method at 25° C. is 10 pC/N or more.

19. The piezoelectric polymer material according to claim 18, wherein the content of the polyvinylidene fluoride is from 0.01 mass % to 5 mass % with respect to the total mass of the polylactic acid-based polymer.

20. The piezoelectric polymer material according to claim 1, wherein the content of inorganic filler with respect to the total mass of the piezoelectric polymer material is less than 1 mass %.

* * * * *